US011688599B1

(12) United States Patent
Lindstrom et al.

(10) Patent No.: US 11,688,599 B1
(45) Date of Patent: Jun. 27, 2023

(54) SENSING DATA RELATED TO CHARGED PARTICLES TO PREDICT AN ANOMALY IN AN ENVIRONMENT

(71) Applicant: Government of the United States, as represented by the Secretary of the Air Force, Kirtland AFB, NM (US)

(72) Inventors: Chadwick Lindstrom, Albuquerque, NM (US); John Ballenthin, Albuquerque, NM (US); David Barton, Los Ranchos, NM (US); Joseph Coombs, Albuquerque, NM (US); Scott Kratochvil, Albuquerque, NM (US); (Continued)

(73) Assignee: Government of the United States of America as represented by the Secretary of the Air Force, Kirtland AFB, NM (US)

( * ) Notice: Subject to any disclaimer, the term of this patent is extended or adjusted under 35 U.S.C. 154(b) by 31 days.

(21) Appl. No.: 16/223,471

(22) Filed: Dec. 18, 2018

Related U.S. Application Data

(60) Provisional application No. 62/694,686, filed on Jul. 6, 2018.

(51) Int. Cl.
*H01J 49/48* (2006.01)
*H01J 37/244* (2006.01)
(Continued)

(52) U.S. Cl.
CPC ............... *H01J 49/48* (2013.01); *H01J 37/05* (2013.01); *H01J 37/244* (2013.01); (Continued)

(58) Field of Classification Search
CPC ............ H01J 49/48; H01J 37/05; H01J 37/244; (Continued)

(56) References Cited

U.S. PATENT DOCUMENTS 10,615,024 B1* 4/2020 Roddy et al. ............ H01J 49/48
2012/0091332 A1* 4/2012 Makarov et al. ...... H01J 49/406
250/281

OTHER PUBLICATIONS

A. Mohammadzadeh et al., "The ESA Standard Radiation Environment Monitor program first results from PROBA-I and INTEGRAL," in IEEE Transactions on Nuclear Science, vol. 50, no. 6, pp. 2272-2277, Dec. 2003.
(Continued)

*Primary Examiner* — Wyatt A Stoffa
(74) *Attorney, Agent, or Firm* — AFNWC/JA; David L. Narciso

(57) ABSTRACT

An environmental sensor may acquire data related to flux and energy of charged particles in an environment for using the data to determine, in substantially real time, whether the environment is conducive to an anomaly caused by the charged particles. The sensor may include an electrostatic analyzer structurally configured for charged particle detection, the electrostatic analyzer generating controllable electric fields to provide energy filtering of incoming charged particles, where, after filtering, the charged particles impact a charge multiplier to establish a detectable signal. The sensor may further include a plurality of silicon detector telescopes structurally configured to collectively detect electrons having energy within the range of about 100 electronvolts (eV) to about 5 mega-electronvolts (MeV) and to collectively detect protons having energy within the range of about 2 MeV to about 100 MeV.

20 Claims, 18 Drawing Sheets

(72) Inventors: David Stiles, Albuquerque, NM (US); Adrian Wheelock, Albuquerque, NM (US); Stephen Quigley, Albuquerque, NM (US); Patrick Roddy, Albuquerque, NM (US); Richard Selesnick, Albuquerque, NM (US)

(51) Int. Cl.
*H01J 37/26* (2006.01)
*H01J 37/05* (2006.01)

(52) U.S. Cl.
CPC .................................. *H01J 37/261* (2013.01)

(58) Field of Classification Search
CPC ...................................................... H01J 37/261
See application file for complete search history.

(56) References Cited

OTHER PUBLICATIONS

B.K. Dichter, et. al, "Compact Environmental Anamoly Sensor (CEASE): A Novel Spacecraft Instrument for In Situ Measurements of Environmental Conditions," IEEE Trans. Nucl. Sci., Vol. 45, No. 6, pp. 2758-2764, 1998.
B.K. Dichter, et. al, "Initial On-Orbit Results From the Compact Environmental Anomaly Sensor (CEASE)," IEEE Trans. Nucl. Sci., Vol.48, No. 6, pp. 2022-2028, 2001.
Brautigam, D.H. (2002). CRRES in review: Space weather and its effects on technology. Journal of Atmospheric and Solar-Terrestrial Physics. 64. 1709-1721. 10.1016/S1364-6826(02)00121-9.
C. D. Lindstrom et al., "The Compact Environmental Anomaly Sensor Risk Reduction: A Pathfinder for Operational Energetic Charged Particle Sensors," in IEEE Transactions on Nuclear Science, vol. 65, no. 1, pp. 439-447, Jan. 2018.
https://web.archive.org/web/20160408080658/http://www.stce.be/esww11/contributions/public/Session11/S11-Ol-07-LindstromC/07_ESWW_Lindstrom_2.pdf (Year: 2014).*
Hughes, A.L. and V. Rojansky (1929), On the analysis of electronic velocities by electrostatic means, Phys. Rev. 34, 284.
J. Allison et al., "Geant4 developments and applications," in IEEE Transactions on Nuclear Science, vol. 53, No. 1, pp. 270-278, Feb. 2006.
J. Bowman, "J1: a small Forth CPU core for FPGAs," in 26th euro-Forth conference, pp. 43-46, 2010.
K. Ryden, "The MERLIN space weather monitor and its planned flight on the Galileo system testbed satellite (GSTB-V2/A)", 55th Int. Astronautical Congress, 2004.

L. Desorgher et al., "ESA Next Generation Radiation Monitor," 2013 14th European Conference on Radiation and Its Effects on Components and Systems (RADECS), Oxford, 2013, pp. 1-5.
McComas, D. J., et al. (1998) The Cassini Ion Mass Spectrometer, Measurement Techniques in Space Plasmas: Particles, R. F. Pfaff, J. E. Borovsky, and D. T. Young, editors. Geophysical Monograph 102.
Neugebauer, M. and CWSnyder (1962), Mission of Mariner II - Preliminary Observations, Science, DOI: 10.1126/science.138.3545.1095-a.
P. P. Jenkins et al., "Initial results from the TacSat-4 solar cell experiment," 2013 IEEE 39th Photovoltaic Specialists Conference (PVSC), Tampa, FL, 2013, pp. 3108-3111.
Panametrics, Inc., Calibration Report for the EPS DOME Sensor Response to Protons (May 30, 1995) (Year: 1995).*
Panametrics, Inc., GOES D, E, F Progress Report — Energentic Particle Sensor Telescope Calibration Work (Nov. 16, 1979) (Year: 1979).*
Rancoita, Silicon detectors and elementary particle physics, 10 J. Phys. G: Nucl. Phys. 299 (1984) (Year: 1984).*
Rodriguez et al., Intercalibration of GOES 8-15 solar proton detectors, Space Weather, 12, 92-109 (2014) (Year: 2014).*
S.R. Messenger, et al., TacSat -4 Radiation Environment and Solar Cell Degradation Correlations Using Onboard Experiments, 50th IEEE Nuclear Space and Radiation Electronics Conference, San Francisco, CA, Jul. 8-12, 2013.
Sablik, M. J., D. Golimowski, J. R. Sharber, and J. D. Winningham (1988), Computer simulation of a 360 degree field-of-view "top-hat" electrostatic analyzer, Rev. Sci. Inst., 59, 146.
Simpson et al., The Ulysses cosmic ray and solar particle investigation, 92 Astron. Astrophys. Suppl Ser. 365 (1992) (Year: 1992).*
Vaneica Y. Young, Gar B. Hoflund, Photoelectron Spectroscopy (XPS and UPS), Auger Electron Spectroscopy (AES), and Ion Scattering Spectroscopy (ISS), in Handbook of Surface and Interface Analysis Methods for Problem-Solving (2009 CRC Press) (Year: 2009).*
W. R. Johnston, et. al, "Recent updates to the AE9/AP9/SPM radiation belt and space plasma specification model," IEEE Trans. Nucl. Sci, Vol. 62, No. 6, pp 2760-2766, doi:10.1109/TNS.2015.2476470.
Smith, ZK. And JR. Day (1971), Mathematical model of ARC Pioneer 6/7 plasma probe, Rev. Sci. Inst., 42, 7, p 968.
Johnstone, AD., et al. (1985), A space-borne plasma analyzer for 3-dimensional measurements of the velocity distribution, IEEE Transaction on Nuclear Science, 32, 1, pp 139-144.
Bronislaw K. Dichter, John McGarity, E. G. Mullen, Donald Brautigam, Gary E. Gallica, Michael J. Golightly, "Calibration of the Compact Environmental Anomaly Sensor (CEASE) for the DSX space weather mission," Proc. SPIE 7438, Solar Physics and Space Weather Instrumentation III, 743807 (Sep. 23, 2009).

* cited by examiner

SENSING DATA RELATED TO CHARGED PARTICLES TO PREDICT AN ANOMALY IN AN ENVIRONMENT

CROSS-REFERENCE TO RELATED APPLICATIONS

This application claims the benefit of U.S. Provisional Application No. 62/694,686 filed on Jul. 6, 2018, the entire content of which is hereby incorporated by reference.

STATEMENT OF GOVERNMENT INTEREST

The invention described herein may be manufactured, used, and licensed by or for the Government of the United States for all governmental purposes without the payment of any royalty.

BACKGROUND

In space, satellites and the like are constantly bombarded by high energy particles that can lead to anomalies resulting in adverse effects for spacecraft operation. The ability to measure high energy electrons and protons in the local environment of a satellite may allow operational users to rule-in or rule-out operating within the environment, distinguish different causes of ambiguous symptoms, and quantify environmental hazard levels.

In particular, the space particle environment presents a number of threats to satellites (and the like) depending on, e.g., the particle type and energy. In this manner, there may be five different populations of interest: (1) low-energy protons, (2) high-energy protons, (3) low-energy electrons, (4) high-energy electrons, and (5) high-energy ions. Each may pose specific measurement and detection challenges.

Energetic electrons (e.g., E > 250 kilo-electronvolts (keV)) may be responsible for deep dielectric charging. These electrons can penetrate into the interior of a spacecraft, e.g., stopping in the dielectric material of coaxial cables. If the buildup is faster than the charge bleed off, a discharge may occur. For example, depending on the electronic circuitry connected to a cable, the effect can range from a harmless data glitch or a complete mission loss. In fact, it is thought that this type of anomaly is the most significant contributor to mission ending anomalies. And, in some orbits, this particle population is responsible for most of the total ionizing radiation dose.

Low energy electrons may be responsible for spacecraft frame charging and differential charging of surface dielectrics. Frame charging may not be a problem—e.g., geosynchronous spacecraft can usually charge up to and greater than ten kilovolts (kV) relative to surrounding plasma without any issues. However, differential dielectric charging can cause nearby surfaces (e.g., surfaces including different materials than the frame) to have large potential differences. For example, resultant discharge between those surfaces can couple into signal cables and cause the same problems as deep dielectric charging. Low energy protons (E < 10 mega-electronvolts (MeV)) may not be a threat to electronics, as they may be easily stopped in the walls of instruments, and the braids or overshields of cables. However, if their energy exceeds a few hundreds of keV, they may begin to punch through instrument surfaces such as a thin glass cover of solar panels where they can begin to damage the cells themselves.

High energy protons may contribute to the total dose as they penetrate into and through a spacecraft. In addition, protons with energies of up to hundreds of MeV may be one of the causes of Single Event Effects (SEEs), with another being high energy ions. Unlike the total dose, which is incremented slowly (particle by particle), SEEs may be caused by a passage of a single particle through an electronic device. For example, digital circuits may be composed of a large number of small cells (e.g., memory cells), and, under most circumstances, a high energy proton may pass through the cell and deposit a small amount of energy, contributing to the total dose. Also, with a much lower probability, the proton can collide with a silicon nucleus in the crystal and cause a nuclear interaction, releasing a large fraction of its energy in that cell. This event can have a number of outcomes from being relatively harmless (such as a temporary bit flip in a data storage) to critically destructive (such as a device gate rupture).

High energy ions may also contribute to SEEs. High energy ions may be both of solar and galactic origin. The SEE production mechanism for heavy ions may be different than for protons. The rate of energy loss by a particle in a material may be proportional to the square of the nuclear charge. This can mean that the rate of energy deposition by iron (atomic number (Z) = 26) is almost 700 times that of a proton of the same velocity. This can result in a very large energy deposition in a small volume. Energetic heavy ions may thus cause SEEs not by nuclear interactions, but by traveling through an electronic component. Therefore, sensors that can be used to predict anomalies caused by charged particles in an environment may be desired.

BRIEF DESCRIPTION OF THE DRAWINGS

The accompanying drawings provide visual representations which will be used to more fully describe various representative embodiments and can be used by those skilled in the art to better understand the representative embodiments disclosed and their inherent advantages. The drawings are not necessarily to scale, emphasis instead being placed upon illustrating the principles of the devices, systems, and methods described herein. In these drawings, like reference numerals may identify corresponding elements.

DETAILED DESCRIPTION

Figure 1:
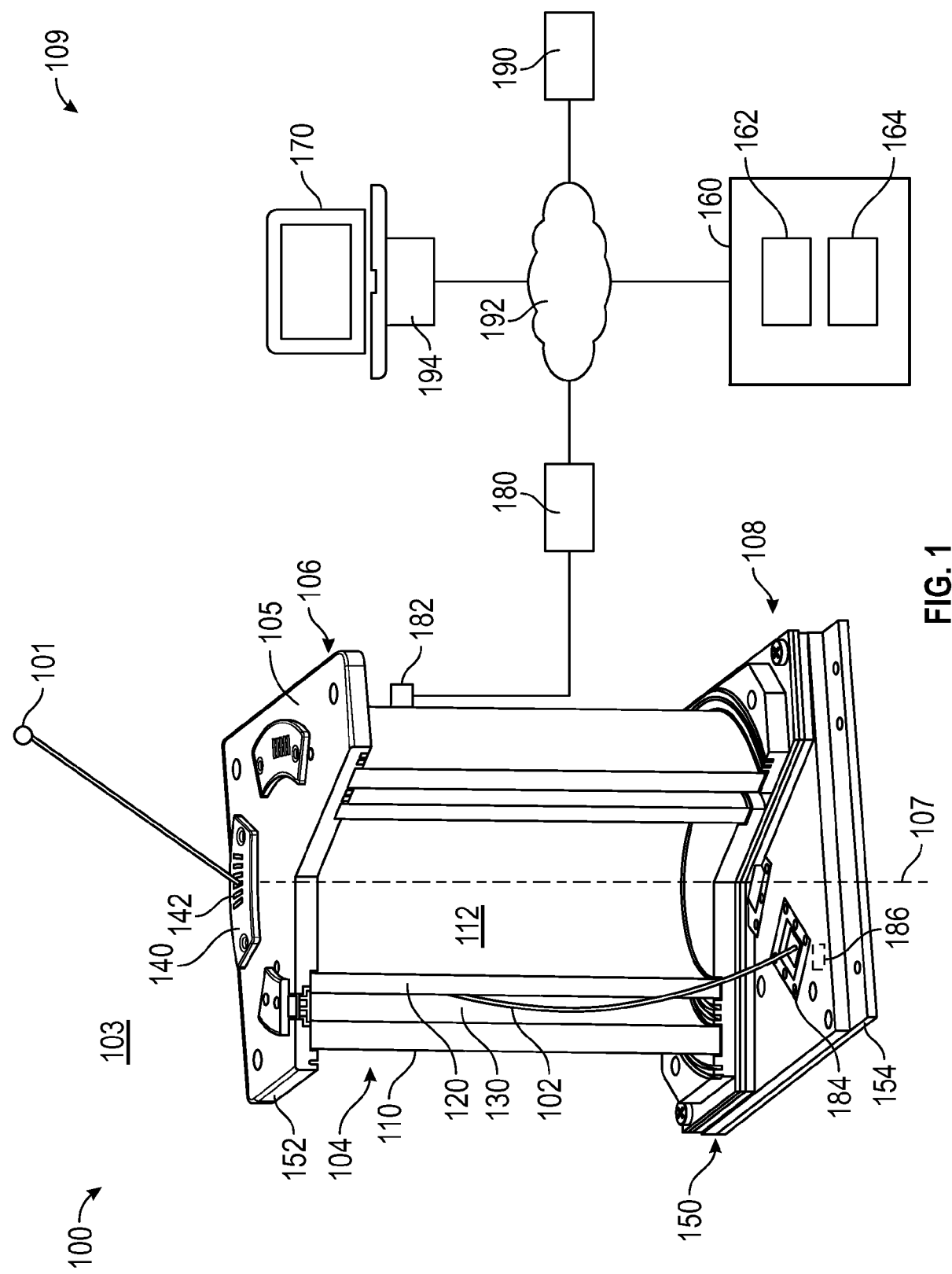
FIG. 1 illustrates an electrostatic analyzer (ESA), in accordance with a representative embodiment.

The various methods, systems, apparatuses, and devices described herein generally relate to environmental sensors that can be used to predict anomalies caused by charged particles in an environment.

While this invention is susceptible of being embodied in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals may be used to describe the same, similar or corresponding parts in the several views of the drawings.

In this document, relational terms such as first and second, top and bottom, and the like may be used solely to distinguish one entity or action from another entity or action without necessarily requiring or implying any actual such relationship or order between such entities or actions. The terms "comprises," "comprising," "includes," "including," "has," "having," or any other variations thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises ... a" does not, without more constraints, preclude the existence of additional identical elements in the process, method, article, or apparatus that comprises the element.

Reference throughout this document to "one embodiment," "certain embodiments," "an embodiment," "implementation(s)," "aspect(s)," or similar terms means that a particular feature, structure, or characteristic described in connection with the embodiment is included in at least one embodiment of the present invention. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C." An exception to this definition will occur only when a combination of elements, functions, steps or acts are in some way inherently mutually exclusive. Also, grammatical conjunctions are intended to express any and all disjunctive and conjunctive combinations of conjoined clauses, sentences, words, and the like, unless otherwise stated or clear from the context. Thus, the term "or" should generally be understood to mean "and/or" and so forth.

All documents mentioned herein are hereby incorporated by reference in their entirety. References to items in the singular should be understood to include items in the plural, and vice versa, unless explicitly stated otherwise or clear from the text.

Recitation of ranges of values herein are not intended to be limiting, referring instead individually to any and all values falling within the range, unless otherwise indicated, and each separate value within such a range is incorporated into the specification as if it were individually recited herein. The words "about," "approximately," or the like, when accompanying a numerical value, are to be construed as indicating a deviation as would be appreciated by one of ordinary skill in the art to operate satisfactorily for an intended purpose. Ranges of values and/or numeric values are provided herein as examples only, and do not constitute a limitation on the scope of the described embodiments. The use of any and all examples, or exemplary language ("e.g.," "such as," or the like) provided herein, is intended merely to better illuminate the embodiments and does not pose a limitation on the scope of the embodiments. No language in the specification should be construed as indicating any unclaimed element as essential to the practice of the embodiments.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

In the following description, it is understood that terms such as "first," "second," "top," "bottom," "up," "down," "above," "below," and the like, are words of convenience and are not to be construed as limiting terms. Also, the terms apparatus and device may be used interchangeably in this text.

As discussed above, sensors that can be used to predict anomalies caused by charged particles in an environment may be desired. To this end, the present teachings may include an environmental sensor that represents an improvement over other sensors, some of which are described below by way of example and for context.

For example, such a sensor (in which the present teachings may improve upon) may include two dosimeter detectors, a particle telescope, and a SEE rate detector. However, this type of sensor may have relatively large dimensions and mass, and relatively high power consumption. This type of sensor may also have limitations on maximum fluxes that can be measured, and the sensor may be susceptible to high energy proton contamination. Also, this type of sensor may have limited flux channel resolution where the channels are fixed. Further, the sensor may not be able to measure electron fluxes below 50 keV.

Another exemplary sensor that the present teachings may improve upon includes a cylindrical electrostatic analyzer (ESA) to measure low energy electrons from 5 keV - 50 keV. However, the ESA may not provide measurements below 5 keV that can potentially assess surface charging. The sensor may also have less tuning than would otherwise be desirable, e.g., where a fixed sweep is used.

Yet another exemplary sensor that the present teachings may improve upon includes the European Space Agency Next Generation Radiation Monitor (NGRM), which includes two detectors based on solid-state sensors for measuring the radiation environment as a secondary sensor (see L. Desorgher et al., "ESA Next Generation Radiation Monitor," 14th European Conference on Radiation and its Effects on Components and Systems (RADECS), Oxford, pp. 1-5, doi: 10.1109/RADECS.2013.6937362 (2013), which is incorporated by reference herein in its entirety). The proton sensor may rely upon degraders between sensors and the total energy deposited in the last triggered detector to determine particle energy. The electron sensor may use solid-state strip detectors to measure electron energy through variable thickness degraders. The sensor may have limitations with regard to its flux dynamic range and channel resolution, and it may not be able to measure electron fluxes below 100 keV.

Another exemplary sensor that the present teachings may improve upon includes "Merlin," which includes four sensors (see K. Ryden, "The MERLIN Space Weather Monitor and its Planned Flight on the Galileo System Testbed Satellite (GSTB-V2/A)," 55th Int'l Astronautical Congress (2004), which is incorporated by reference herein in its entirety). The first sensor in Merlin is called "SURF" and may include a sequence of coaxial metal plates designed to measure current flow from a space environment to the surface or interior of a spacecraft, where these currents may give rise to surface and internal charging. However, because it may only have three plates, it may provide limited information for a spacecraft that can have a large number of shielding depths. Thus, it may be desirous to have a more comprehensive electron spectrum. The second sensor in Merlin may include two Radiation-sensing Field-Effect Transistors (RadFETs) intended to measure total dose behind different shielding thicknesses in a spacecraft. Once again, this may provide limited information as only two shielding depths are used. The third sensor in Merlin may include a two element solid state silicon telescope for measuring proton flux greater than 40 MeV. Once again, this may only include a single point in the flux spectrum, and thus a more comprehensive design may be desired.

Yet another exemplary sensor that the present teachings may improve upon includes the European Space Agency Standard Radiation Environment Monitor (SREM). This sensor was the predecessor to the NGRM discussed above, and may include two solid-state sensors (see A. Mohammadzadeh et al., "The ESA Standard Radiation Environment Monitor Program First Results from PROBA-I and INTEGRAL," IEEE Trans. Nucl. Sci., Vol. 50, No. 6, pp. 2272-77, doi: 10.1109/TNS.2003.821796 (2003), which is incorporated by reference herein in its entirety). The first solid-state sensor may be a single silicon detector behind 0.7-mm thick aluminum foil, which may be sensitive to electrons greater than 0.5 MeV and protons greater than 10 MeV. The second solid-state sensor may include two coaxial silicon detectors mounted behind a 2-mm thick aluminum window. The SREM may have limitations with regard to its flux dynamic range, channel resolution, and background rejection, and it may not be able to measure electron fluxes below 500 keV or protons below 10 MeV. Thus, a more encompassing sensor may be desirous.

Therefore, improved charged particle sensing and measurement may be desired, e.g., for use in predicting anomalies in an environment such as space. To this end, in general, the devices, systems, and methods described herein may include an environmental sensor for acquiring data related to flux and energy of charged particles in an environment. This data may be used to determine, in substantially real time, whether the environment is conducive to an anomaly caused by the charged particles, or to predict the likelihood of an anomaly. It will be understood that an environmental sensor discussed herein may include an improvement to those taught in B.K. Dichter et. al, "Compact Environmental Anomaly Sensor (CEASE): A Novel Spacecraft Instrument for In Situ Measurements of Environmental Conditions," IEEE Trans. Nucl. Sci., Vol. 45, No. 6, pp. 2758-64 (1998), which is incorporated by reference in its entirety. Further, an environmental sensor discussed herein may be the same or similar to those described in C. Lindstrom et al., "The Compact Environmental Anomaly Sensor Risk Reduction (CEASE-RR): A Pathfinder for Operational Energetic Charged Particle Sensors," IEEE Trans. Nucl. Sci., Vol. 65, No. 1, pp. 439-447 (2018), which is incorporated by reference in its entirety.

An environmental sensor according to the present teachings may thus include a version of a compact environmental anomaly sensor, which may be designed to measure energetic electrons and protons in an environment such as space. In general, an environmental sensor according to the present teachings may include at least four sensors —three of the sensors may be independent silicon detector stacks (e.g., a low energy proton electron telescope (LEPET), a medium energy proton electron telescope (MEPET), and a high energy proton electron telescope (HEPET)). The fourth sensor may be an electrostatic analyzer (ESA), which may use electric fields for energy filtering and charge multiplication for particle detection. The sensors may collectively cover a range from about 100 electronvolts (eV) to about 5 mega-electronvolts (MeV) for electrons and from about 2 MeV to about 100 MeV for protons, all in sufficient detail so that the measured particle spectrum can be used to predict the relative hazard level of a local space charged particle environment. In this manner, an environmental sensor as described herein may be the instrument on a spacecraft that provides proportional real-time measurements of the local charged particle flux versus energy. It will be understood that an environmental sensor as described herein may also or instead be used in satellite systems, space vehicles, for space exploration, and the like, and/or it may be used in a laboratory setting. An environmental sensor as described herein may thus be useful to both government and commercial entities.

Before describing an environmental sensor according to the present teachings in further detail, a description of an electrostatic analyzer (ESA) that can be used in such an environmental sensor is provided below. In general, the ESA may be the same or similar to any of those described in U.S. Pat. Application No. 16/223,425 filed on Dec. 18, 2018, the entire content of which is hereby incorporated by reference.

Electrostatic Analyzer (ESA)

Thus, the devices, systems, and methods described herein may include an electrostatic analyzer (ESA). Specifically, an ESA according to the present teachings may include an instrument that is used to determine the energy spectrum of a charged particle population, and/or to filter such a spectrum to select particles within a particular energy band. More specifically, an ESA according to the present teachings may only filter one component of a particle's velocity vector, which can allow for the ESA to include a relatively compact design and can extend the range of the ESA to higher energies.

For example, an ESA as described herein may be integrated into a space particle sensor or the like for characterizing the energy spectrum of plasma energy (e.g., about 50 eV to about 50 keV) electrons in a near-earth environment or the like. As discussed herein, an ESA may include a spiral or helical geometry that permits a relatively compact design and a relatively high-energy range (compared to a more conventional ESA) because the filtering and analysis may be done on only one component of the particle's kinetic energy vector. In addition, an ESA as described herein may include features structurally configured to prevent light pollution. Such an ESA may be used on satellites (e.g., by a commercial satellite company, or as part of a space science mission) or on other space equipment or vehicles, e.g., for space weather science, as an energetic electron filter, for general space particle instrumentation, and the like.

FIG. 1 illustrates an ESA 100, in accordance with a representative embodiment. In general, the ESA 100 may be an apparatus that is structurally configured to filter and detect a charged particle 101 based on its (i) energy (e.g., kinetic energy) and (ii) arrival trajectory or path (e.g., its arrival angle relative to the ESA 100). The ESA 100 may generally be a spiral ESA, or one that defines a helical path 102 for charged particles 101 to travel therein and therethrough. The ESA 100 may generally include a coaxial structure 104 and one or more entrance filters 140.

The coaxial structure 104 of the ESA 100 may include an outer conductive cylinder 110, an inner conductive cylinder 120, and one or more pathways 130 disposed between the outer conductive cylinder 110 and the inner conductive cylinder 120 that extend from a first end 106 of the coaxial structure 104 to a second end 108 of the coaxial structure 104. The outer conductive cylinder 110 may define a void 112 therein, where the inner conductive cylinder 120 is disposed at least partially within the void 112. Generally, the outer conductive cylinder 110 and the inner conductive cylinder 120 may each be structurally configured to receive a bias voltage for creation of a predetermined electric field therebetween that allows for the passage of charged particles 101 with a predetermined energy/charge band along a helical path 102 through the coaxial structure 104. The predetermined energy (by which particles may be filtered for analysis by the ESA 100) may include a specific charge of a particle, a particle having a specific kinetic energy, and combinations thereof. Thus, the kinetic energy/charge ratio may be the salient attribute for filtering the charged particles 101, and there may be a specific, predetermined bandwidth of acceptance—in this manner, it will be understood that predetermined energy as described herein may include a kinetic energy/charge ratio.

As discussed herein, the ESA 100 may include one or more entrance filters 140. Specifically, an entrance filter 140 may be disposed on the first end 106 of the coaxial structure 104, e.g., between one or more of the pathways 130 contained therein and an external environment 103. One or more of the entrance filters 140 may define a plurality of openings 142 aligned at a predetermined angle thereby limiting one or more fields of view between a pathway 130 and the external environment 130. The predetermined angle, and thus the openings 142, may be structurally configured to filter particles, by their trajectory, from entering a pathway 130 for analysis by the ESA 100. Further, particles that traverse through a pathway 130 from the external environment 130 to the second end 108 of the coaxial structure 104 may be controlled according to a kinetic energy of the particles. Controlling of the particles through the ESA 100 may be provided by the bias voltage applied to the ESA 100, i.e., to one or more of the outer conductive cylinder 110 and the inner conductive cylinder 120. Controlling of the particles through the ESA 100 may also or instead be provided by a length and a radius of one or more of the outer conductive cylinder 110 and the inner conductive cylinder 120. Further, controlling of the particles through the ESA 100 may also or instead be provided by the predetermined angle of one or more of the openings 142 of one or more of the entrance filters 140. For example, the predetermined angle of one or more of the openings 142 of one or more of the entrance filters 140 may be adjustable.

The adjustability of the predetermined angle may be provided by interchanging one entrance filter 140 (e.g., an entrance filter 140 having a first set of openings 142 with a first angle) with another entrance filter 140 (e.g., a different entrance filter 140 having a second set of openings 142 with a second angle that is different from the first angle). Also, or instead, the openings 142 on the entrance filter 140 may be adjustable, e.g., a size, a shape, an entrance angle, and so on, may be adjustable on the entrance filter 140 itself, such that the predetermined angle may be adjusted without removing the entrance filter 140. Moreover, the entrance filter 140 itself may be adjustable (e.g., relative to the general structure of the ESA 100) to adjust the predetermined angle or another parameter.

In certain implementations, the predetermined angle is between 10-degrees and 80-degrees relative to a plane disposed through the first end 106 of the coaxial structure 104 (e.g., a plane that intersects a substantial portion of the top surface 105 of the ESA 100, such as a plane that is substantially orthogonal to the cylinder axis 107). More generally, the predetermined angle may be any angle between 0-degrees and 90-degrees. Thus, it will be understood that, theoretically, there is generally not a real limit to what the predetermined angle can be—and therefore, many different configurations for the openings 142 are possible.

As shown in FIG. 1, there may be a separate entrance filter 140 for each pathway 130 in the ESA 100, and each of these separate entrance filters 140 may include its own plurality of openings 142. By way of example, three entrance filters 140 are shown in FIG. 1, but it will be understood that more or less are possible. In certain implementations, the predetermined angle of the plurality of openings 142 for each separate entrance filter 140 may be the same. In other implementations, the predetermined angle of the plurality of openings 142 for each separate entrance filter 140 may be different.

As discussed herein, and as explained in more detail with reference to FIGS. 2-4, the ESA 100 shown in FIG. 1 may include channels that contain a pathway 130 for charged particles 101 to travel through, i.e., through the ESA 100 from the first end 106 of the coaxial structure 104 to the second end 108 of the coaxial structure 104.

Turning back to FIG. 1, the ESA 100 may include a housing 150. The housing 150 may hold or contain one or more of the components of the ESA 100. For example, and as shown in the figure, the top surface 105 of the ESA 100 may be defined by a surface of the housing 150. Thus, an entrance filter 140 for the ESA 100 may be disposed on the housing 150, or a portion thereof that is coupled to the first end 106 of the coaxial structure 104. The housing 150, or a portion thereof, may be removable and replaceable on the first end 106 of the coaxial structure 104. In this manner, removing and replacing a portion of the housing 150 may include removing and replacing an entrance filter 140 (e.g., for adjustment of the predetermined angle) or another component of the ESA 100. In certain implementations, the housing 150, or a portion thereof, may be adjustable on the first end 106 of the coaxial structure 104. In this manner, adjustment of a portion of the housing 150 may include adjustment of an entrance filter 140 (e.g., for adjustment of the predetermined angle) or another component of the ESA 100. The housing 150 may include one or more plates 152 affixed to the coaxial structure 104 or another portion of the ESA 100.

The ESA 100 may further include one or more endcaps 154, e.g., further to the housing 150 or in lieu of the housing 150 (or a portion thereof). An endcap 154 may be engaged with at least one of the first end 106 of the coaxial structure 104 and the second end 106 of the coaxial structure 104, e.g., both ends of the coaxial structure 104. Further, one or more of the endcaps 154 may be insulated. Also, or instead, other portions of the housing 150 or the ESA 100 may be insulated.

The ESA 100 (or a system 109 containing the ESA 100) may include a controller 160, a computing device 170, one or more power sources 180, and other hardware 190, where one or more of these components may be interconnected via a data network 192 or the like using one or more communication interfaces 194.

The ESA 100 may also include an electrical connection 182 coupling the ESA 100 to one or more of the power sources 180. The electrical connection 182 may include separate connections for each cylinder of the coaxial structure 104, e.g., a first electrical connection coupled to the outer conductive cylinder 110 and a second electrical connection coupled to the inner conductive cylinder 120. Thus, a power source 180 may be coupled to the electrical connection 182, e.g., at least one of the aforementioned first electrical connection and second electrical connection. Other electrical connections 182 are also or instead possible. The controller 160 may be configured to receive an input to control at least one of the power source 180 and the electrical connection 182 (e.g., the first electrical connection and the second electrical connection). In this manner, the controller 160 may be configured to adjust the bias voltage supplied to the ESA 100—e.g., a first bias voltage applied to the outer conductive cylinder 110 and a second bias voltage applied to the inner conductive cylinder 120.

The ESA 100 may further include a charge multiplier 184. The charge multiplier 184 may be structurally configured to collect and amplify a signal obtained from a particle at the second end 108 of the coaxial structure 104. For example, the ESA 100 may include a charge multiplier 184 disposed beneath the coaxial structure 104, where the charge multiplier 184 is structurally configured to act as a background detector for the ESA 100. The charge multiplier 184 may also or instead be coaxially aligned with the coaxial structure 104. The ESA 100 may also or instead include a wire mesh 186 (or the like) that is structurally configured to contain an electric field of a particle and provide acceleration to the particle.

The controller 160 may be used for controlling operation of one or more of the components of the system 109 or the ESA 100, e.g., the entrance filter 140, the power source 180 (or otherwise the bias voltage supplied to the ESA 100), the charge multiplier 184, and so on. The controller 160 may include, or otherwise be in communication with, a processor 162 and a memory 164. The controller 160 may be electronically coupled (e.g., wired or wirelessly) in a communicating relationship with one or more of the components of the system 109. Thus, in an implementation, the controller 160 may include a processor 162 and a memory 164, where the processor 162 is configured to control the ESA 100 according to one or more of analyzer feedback, predetermined instructions, instructions based on algorithmic calculations, and the like.

As discussed above, the controller 160 may be operable to control the components of the system 109, where the controller 160 may include any combination of software and/or processing circuitry suitable for controlling the various components of the system 109 described herein including without limitation processors, microprocessors, microcontrollers, application-specific integrated circuits, programmable gate arrays, and any other digital and/or analog components, as well as combinations of the foregoing, along with inputs and outputs for transceiving control signals, drive signals, power signals, sensor signals, and the like. In certain implementations, the controller 160 may include the processor 162 or other processing circuitry with sufficient computational power to provide related functions such as executing an operating system, providing a graphical user interface (e.g., to a display coupled to the controller 160 or another component of the system 109), set and provide rules and instructions for operation of the ESA 100 or another component of the system 109, convert sensed information into positioning or other instructions, and operate a web server or otherwise host remote operators and/or activity through the communications interface 194 such as that described below. In certain implementations, the controller 160 may include a printed circuit board, an Arduino controller or similar, a Raspberry Pi controller or the like, a prototyping board, or other computer related components.

The controller 160 may be a local controller disposed on the ESA 100, or a remote controller 160 otherwise in communication with the ESA 100 and its components. For example, one or more of the controller 160 and a user interface in communication with the controller 160 may be disposed on an external component (e.g., a computing device 170) in communication with the ESA 100 over a data network 192.

The processor 162 of the controller 160 may include an onboard processor for the ESA 100. The processor 162 may also or instead be disposed on a separate computing device 170 that is connected to the ESA 100 through a data network 192, e.g., using the communications interface 194, which may include a satellite communications system, a Wi-Fi transmitter and receiver, and the like. The processor 162 may be any as described herein or otherwise known in the art. The processor 162 may be included on the controller 160, or it may be separate from the controller 160, e.g., it may be included on a computing device 170 in communication with the controller 160 or another component of the system 109. In an implementation, the processor 162 is included on, or in communication with, a server that hosts an application for operating and controlling the system 109.

The memory 164 may be any as described herein or otherwise known in the art. The memory 164 may contain computer code and may store data such as sequences of analysis or otherwise for the ESA 100. The memory 164 may contain computer executable code stored thereon that provides instructions for the processor 162 for implementation. The memory 164 may include a non-transitory computer readable medium.

The system 109 may include a computing device 170 in communication with one or more of the components of the system 109 including without limitation the controller 160. The computing device 170 may include any components within the system 109 operated by users or otherwise to manage, monitor, communicate with, or otherwise interact with other components in the system 109. This may include desktop computers, laptop computers, network computers, tablets, smartphones, smart watches, or any other device that can participate in the system 109 as contemplated herein. In an implementation, the computing device 170 (and a user interface thereof) is integral with another participant in the system 109.

The data network 192 may be any network(s) or internetwork(s) suitable for communicating data and control information among participants in the system 109. This may include a satellite network, public networks such as the Internet, private networks, telecommunications networks such as the Public Switched Telephone Network or cellular networks using third generation (e.g., 3G or IMT-2000), fourth generation (e.g., LTE (E-UTRA) or WiMAX-Advanced (IEEE 802.16m) and/or other technologies, as well as any of a variety of corporate area or local area networks and other switches, routers, hubs, gateways, and the like that might be used to carry data among participants in the system 109. The data network 192 may include wired or wireless networks, or any combination thereof. As discussed herein, the data network 192 may also or instead include a satellite communications system. One skilled in the art will also recognize that the participants shown the system 109 need not be connected by a data network 192, and thus can be configured to work in conjunction with other participants independent of the data network 192.

Communication over the data network 192, or other communication between components of the system 109 described herein, may be provided via one or more communications interfaces 194. The communications interface 194 may include, e.g., a Wi-Fi receiver and transmitter to allow the logic calculations to be performed on a separate computing device 170. This may include connections to smartphone applications and the like. More generally, the communications interface 194 may be suited such that any of the components of the system 109 can communicate with one another. Thus, the communications interface 194 may be present on one or more of the components of the system 109. The communications interface 194 may include, or be connected in a communicating relationship with, a network interface or the like. The communications interface 194 may include any combination of hardware and software suitable for coupling the components of the system 109 to a remote device (e.g., a computing device 170 such as a remote computer or the like) in a communicating relationship through a data network 192. By way of example and not limitation, this may include electronics for a wired or wireless Ethernet connection operating according to the IEEE 802.11 standard (or any variation thereof), or any other short or long-range wireless networking components or the like. This may include hardware for short-range data communications such as Bluetooth or an infrared transceiver, which may be used to couple into a local area network or the like that is in turn coupled to a data network 192 such as the internet. This may also or instead include hardware/software for a WiMAX connection or a cellular network connection (using, e.g., CDMA, GSM, LTE, or any other suitable protocol or combination of protocols). Additionally, the controller 160 may be configured to control participation by the components of the system 109 in any network to which the communications interface 194 is connected, such as by autonomously connecting to the data network 192 to retrieve status updates and the like.

The system 109 may include other hardware 190. In certain implementations, the other hardware 190 may include a camera or other sensors. The other hardware 190 may also or instead include input devices such as a keyboard, a touchpad, a computer mouse, a switch, a dial, a button, and the like, as well as output devices such as a display, a speaker or other audio transducer, light emitting diodes or other lighting or display components, and the like. Other hardware 190 of system 109 may also or instead include a variety of cable connections and/or hardware adapters for connecting to, e.g., external computers, external hardware, external instrumentation or data acquisition systems, and the like. The other hardware 190 may also or instead include mechanical devices for movement of one or more components of the system 109, e.g., actuators, motors, gears, and the like.

The power source 180 may include any as known in the art. For example, the power source 180 may include a battery, a rechargeable power supply (e.g., utilizing energy from the sun), and so on.

An ESA 100 according to the present teachings may exploit the inability of a cylindrical section ESA to select the energy component parallel to a cylinder axis 107 through the ESA 100. That is, the 1/r electric field between the cylinders in the ESA 100 may be purely radial. To a particle fired between the plates, purely parallel to the cylinder axis 107, it may appear to be traversing a parallel plate ESA and therefore may only act as a high pass filter. To a particle traveling tangential to the cylinders, it may appear to be moving in a more traditional cylindrical ESA. An ESA 100 according to the present teachings, however, may be designed to filter particles that have a path that is partially tangential and partially along the cylinder axis 107. By doing this, the ESA 100 can analyze particles of the same kinetic energy with a lower inter-plate potential difference relative to other ESA geometries. This may be highly desirable as higher voltages can present increased engineering challenges that lead to larger, more complex, and ultimately more expensive instruments. However, allowing particles to enter through an aperture and spiral through the ESA 100 may present a problem as particle energy and arrival angle are inexorably coupled, and, to compensate for this, the ESA 100 may incorporate the entrance filter 140, which acts as a view-limiting entrance aperture. The design of the entrance filters 140 can thus significantly alter performance characteristics of the ESA 100 by defining the look angle and field of views (variables gamma and epsilon in Equations 1 and 3 below).

The design of the ESA 100 may permit relatively easy interchangeability of the entrance filters 140, which can allow for a single ESA 100 to be manufactured and later tuned to meet specific operational requirements of energy bandpass, geometric factor, and field of view, e.g., by replacing an entrance filter 140.

An ESA 100 according to the present teachings may also address another inherently crippling shortcoming of other ESAs—ultraviolet (UV) light contamination. Like a parallel plate ESA, a spiral ESA may offer very few bounce paths for light between an entrance aperture and the detector. A charge multiplier 184 (used in this and other ESAs) may be sensitive to both charged particles 101 and photons, particularly at solar wavelengths. Other spiral ESA designs can allow UV light entering one aperture to be measured on all detectors, even ones that are "pointed" away from the UV source. An ESA 100 according to the present teachings, however, may mitigate this problem by channelizing the individual particle paths in one or more of the following manners: (1) physical separation of channels by a dissipative insulator, or (2) the addition of many bounce paths, e.g., by a notch-and-vane geometry (or similar) for the cylinders. The manufacture of such a notch-and-vane geometry may be simplified through 3D printing (e.g., direct metal laser sintering) of the cylinders.

Thus, as described herein, the ESA 100 may include a coaxial structure 104 featuring two coaxial conductive cylinders placed one inside another—e.g., an outer conductive cylinder 110 and an inner conductive cylinder 120—with one or more electrical connections 182 to apply bias voltages. The length and radii of the cylinders may define the mean energy of particles that traverse the ESA 100 as set forth in the following equations.

$$\text{Kinetic Energy} = \frac{q(V_o - V_i)}{2\ln\left(\frac{r_o}{r_i}\right)\sin^2(\gamma \pm \varepsilon)} \quad \text{Equation 1}$$

$$\gamma = \tan^{-1}\left(\frac{\theta \bar{r}}{l}\right) \quad \text{Equation 2}$$

$$\varepsilon = \tan^{-1}\left(\frac{s_\theta}{d} + \tan\gamma\right) - \gamma \quad \text{Equation 3}$$

In these equations, 'V' is the voltage applied to a cylinder, 'r' is the radius of a cylinder, theta is the angular distance a particle travels through the ESA 100, and 'l' is the length of the cylinders. The subscripts 'i' and 'o' denote the inner and outer cylinders, respectively. The value r-bar is the mean radius of the cylinders. The variable gamma is the pitch of the spiral path that particles may take through the ESA 100. The variable epsilon is the half-angle acceptance defined by the geometry of the openings 142 of the entrance filter 140. The +/- epsilon in Equation 1 thus denotes the energy bandpass width of the ESA 100 as defined by the openings 142 of the entrance filter 140. S-theta is the angular width of a single opening 142 and 'd' is the thickness of the opening 142.

As described herein, the ESA 100 may include entrance filters 140 placed at specific locations around the top surface 105 of the ESA 100 and in-between the cylinders of the ESA 100. Each of the entrance filters 140 may include openings 142 that are angled in a certain manner to limit a field of view to provide at least some collimation of particles entering the ESA 100. The ESA 100 may further include an array of charge multipliers 184 at expected particle exit points to collect and amplify the signal obtained from a charged particle 101. The ESA 100 may further include grids of wire mesh 186, e.g., placed between the bottom of the cylinders and the charge multipliers 184 to contain the electric fields and to provide post-acceleration. The ESA 100 may further include specific channelization that is structurally configured to block UV light from cross-channel contamination or other contamination. The ESA 100 may also include endcaps 154, e.g., for insulating and/or mounting of the ESA 100.

Figure 2:
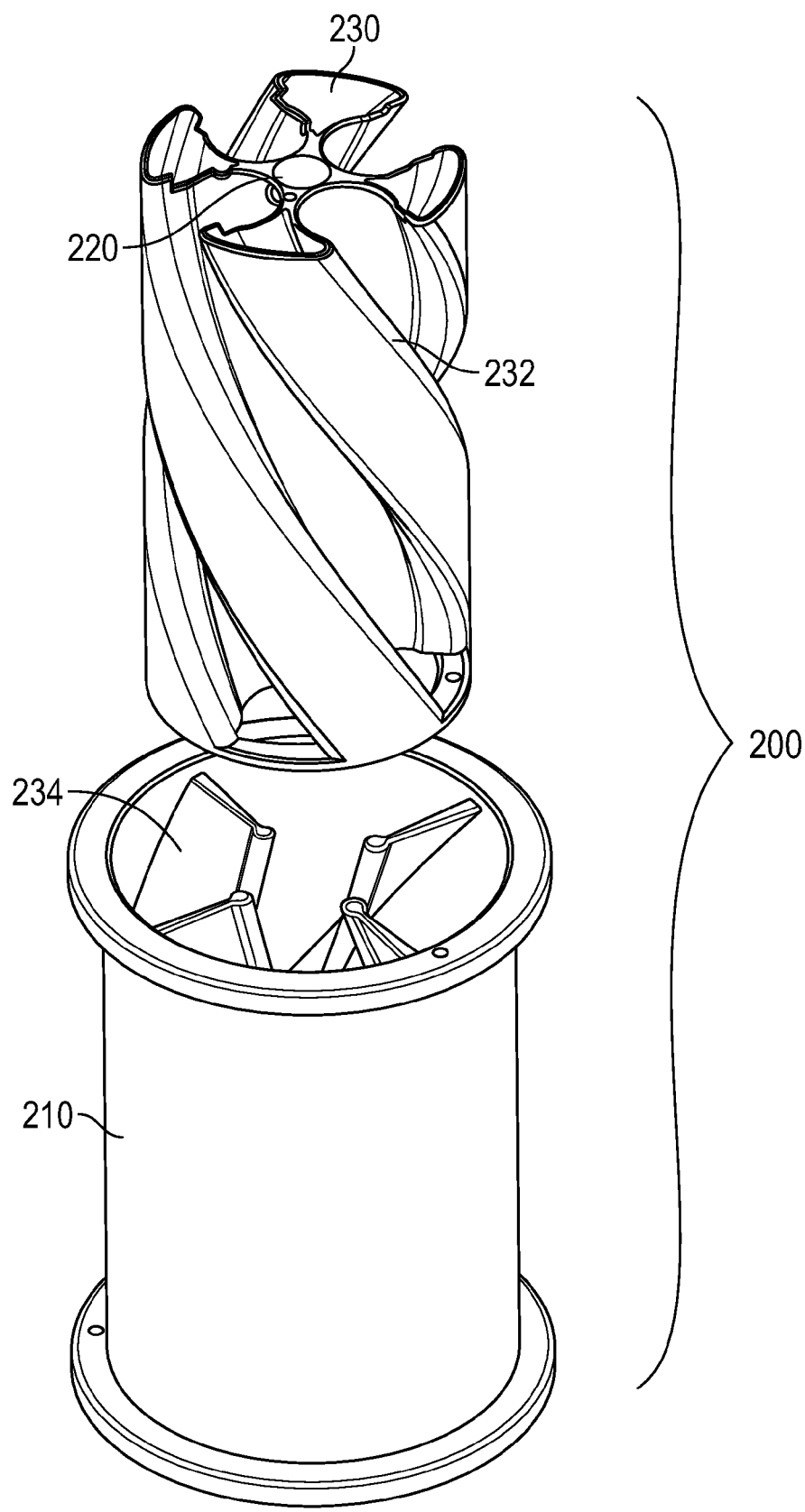
FIG. 2 illustrates an exploded view of a coaxial structure of an ESA, in accordance with a representative embodiment.
Figure 3:
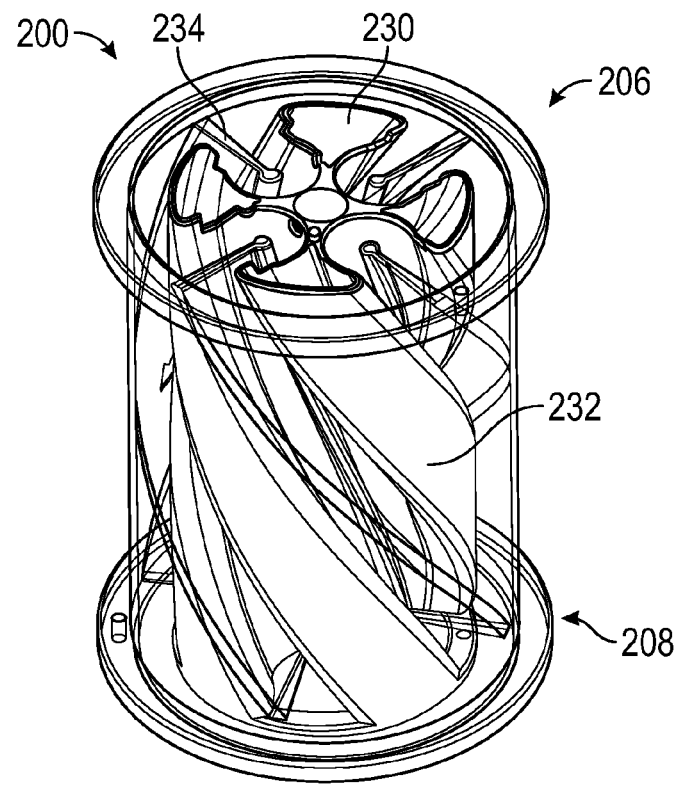
FIG. 3 illustrates a transparent side view of a coaxial structure of an ESA, in accordance with a representative embodiment.
Figure 4:
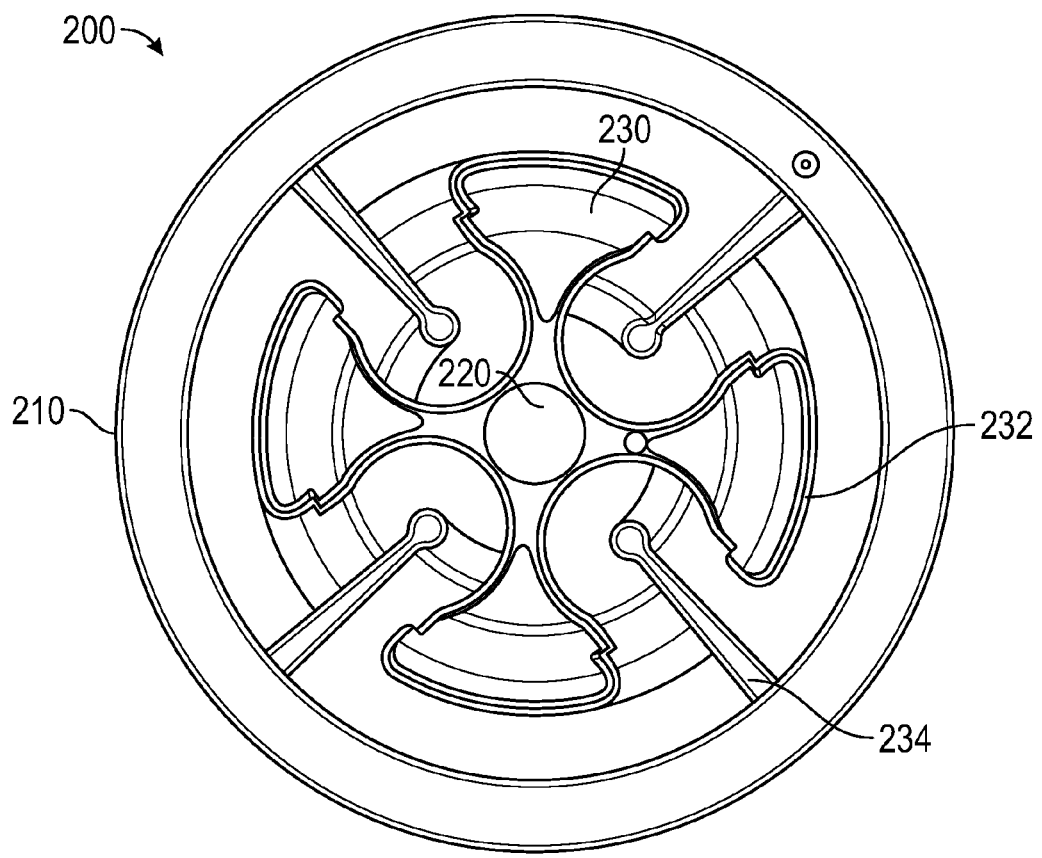
FIG. 4 illustrates a top view of a coaxial structure of an ESA, in accordance with a representative embodiment.

FIGS. 2-4 show further details of a coaxial structure 200 that may be included in an ESA according to the present teachings, such as the ESA 100 shown in FIG. 1. Specifically, FIG. 2 illustrates an exploded view of a coaxial structure 200 of an ESA, FIG. 3 illustrates a transparent side view of the coaxial structure 200, and FIG. 4 illustrates a top view of the coaxial structure 200, in accordance with a representative embodiment. As shown in these figures, the coaxial structure 200 may have one or more channels 232 formed therein, where the shape of the coaxial structure 200 may have a notch-and-vane design that resembles a cloverleaf, e.g., with four channels 232 forming each "leaf" of the cloverleaf shape.

Thus, as explained herein, the coaxial structure 200 may define one or more pathways 230 disposed between an outer conductive cylinder 210 and an inner conductive cylinder 220, where the pathways 230 extend from a first end 206 of the coaxial structure 200 to a second end 208 of the coaxial structure 200. The outer conductive cylinder 210 and the inner conductive cylinder 220 may each be structurally configured to receive a bias voltage for the creation of a predetermined electric field therebetween that allows for the passage of charged particles with a predetermined energy/charge band along a helical path through the coaxial structure 200.

As described above, at least one of the pathways 230 of the coaxial structure 200 may be contained in a channel 232 formed between the first end 206 of the coaxial structure 200 and the second end 208 of the coaxial structure 200. The channel 232 may be shaped as a helical structure disposed at least partially about the inner conductive cylinder 220 as shown in the figures. More specifically, the channel 232 may be sized and shaped to permit certain particles to travel within the channel 232 from the first end 206 of the coaxial structure 200 to the second end 208 of the coaxial structure 200, and to prevent other particles from traveling within the channel 232 from the first end 206 of the coaxial structure 200 to the second end 208 of the coaxial structure 200. For example, a channel 232 may be sized and shaped to block photons from traversing from the first end 206 of the coaxial structure 200 to the second end 208 of the coaxial structure 200, e.g., where these photons might interfere with an analysis of charged particles. That is, photons that reach the electron multiplier may generate false counts, and thus, blocking such photons from reaching the electron multiplier may be desired. Similarly, the channel 232 may also or instead be sized and shaped to block photons from traversing from an external environment to the second end 208 of the coaxial structure 200. The channel 232 may also or instead be sized and shaped to block photons from traversing from one channel 232 to another, different channel 232.

At least one of the pathways 230 of the coaxial structure 200 (e.g., each pathway 230) may be contained in its own distinct channel 232 formed between the first end 206 of the coaxial structure 200 and the second end 208 of the coaxial structure 200. The number of channels 232 may vary from ESA to ESA. For example, in certain implementations, the coaxial structure 200 may include at least two distinct channels 232; in other implementations, the coaxial structure 200 may include at least four distinct channels 232 as shown in the figures. For example, and as discussed above, a formation of four distinct channels 232 may resemble a cloverleaf-type structure. Such a cloverleaf-type structure may provide a relatively complex shape that effectively channelizes the ESA. Also, or instead, an opening for each channel 232 may be disposed about 90-degrees from one another at the first end 206 of the coaxial structure 200. Other arrangements for the channels 232 are also or instead possible.

The coaxial structure 200 (or an ESA containing the coaxial structure 200) may include one or more baffles 234 therein or thereon. For example, a baffle 234 may be disposed between each distinct channel 232. In this manner, a baffle 234 may act as a dissipative insulator. In certain implementations, at least one pathway is defined by one or more baffles 234 disposed between the inner conductive cylinder 220 and the outer conductive cylinder 210. The baffles 234 may also or instead aid in blocking photons from traversing through the coaxial structure 200. Thus, a baffle 234 may be structurally configured to block photons from traveling from one pathway 230 or channel 232 to another pathway 230 or channel 232. Also, or instead, a baffle 234 may be structurally configured to block photons from traversing from the first end 206 of the coaxial structure 200 to the second end 208 of the coaxial structure 200, and/or from traversing from an external environment to the first end 206 or the second end 208 of the coaxial structure 200. In certain implementations, a baffle 234 may be less conductive than each of the outer conductive cylinder 210 and the inner conductive cylinder 220. To this end, a baffle 234 may include a static dissipative material.

Figure 5:
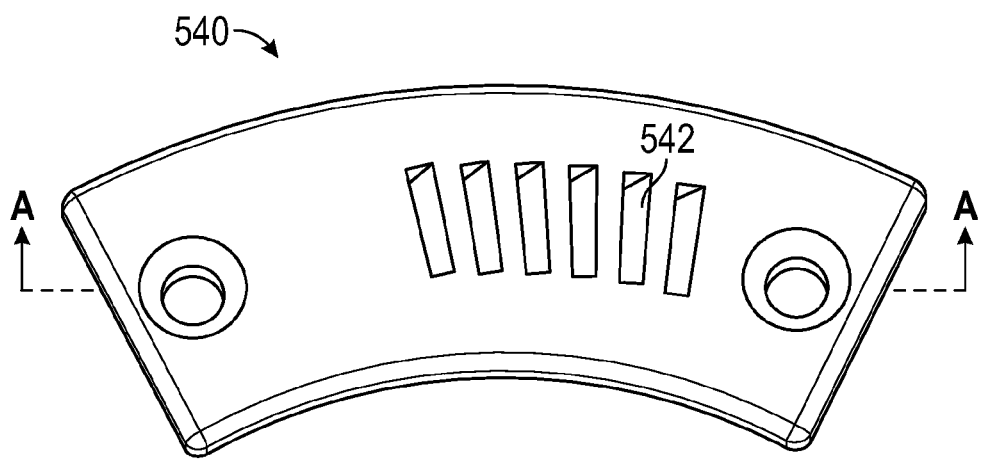
FIG. 5 illustrates a top view of an entrance filter of an ESA, in accordance with a representative embodiment.
Figure 6:
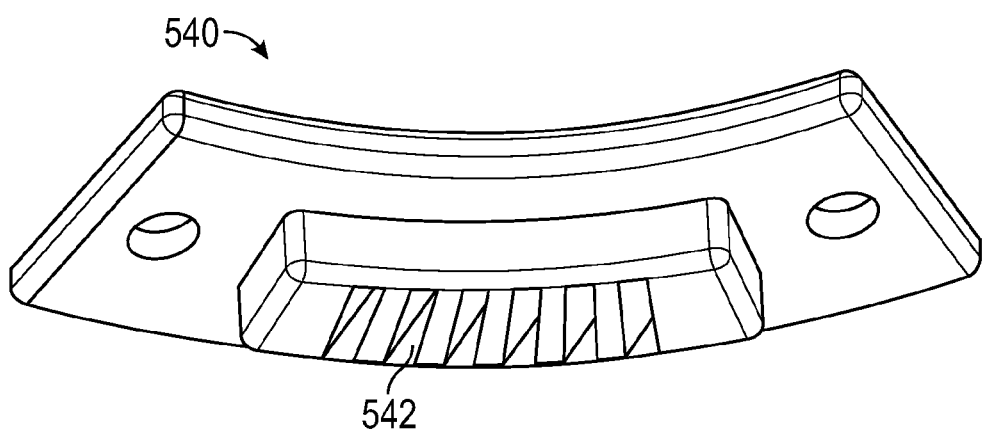
FIG. 6 illustrates a bottom perspective view of an entrance filter of an ESA, in accordance with a representative embodiment.
Figure 7:
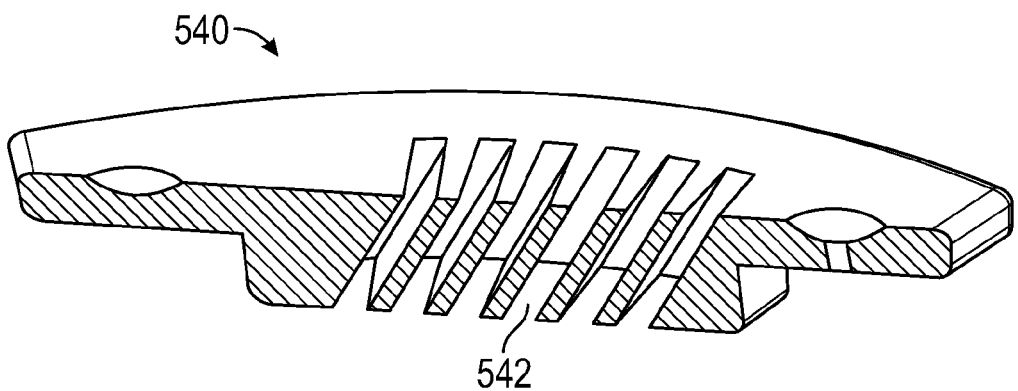
FIG. 7 illustrates a cutaway of an entrance filter of an ESA through Section A-A of FIG. 5, in accordance with a representative embodiment.

FIGS. 5-7 show further details of an entrance filter 540 that may be included in an ESA according to the present teachings, such as the ESA 100 shown in FIG. 1. Specifically, FIG. 5 illustrates a top view of the entrance filter 540 of an ESA, FIG. 6 illustrates a bottom perspective view of the entrance filter 540, and FIG. 7 illustrates a cutaway of the entrance filter 540 through Section A-A of FIG. 5, in accordance with a representative embodiment.

As discussed herein, the entrance filter 540 may be placed on the first end of a coaxial structure of an ESA, where the entrance filter 540 is disposed between a pathway through the coaxial structure and an external environment. The entrance filter 540 may define a plurality of openings 542 aligned at a predetermined angle thereby limiting one or more fields of view between a pathway through the coaxial structure and an external environment. Thus, the entrance filter 540 may be structurally configured to filter particles, by their trajectory, from entering the coaxial structure (or traveling therethrough) for analysis by an ESA.

Various equations used to design an ESA according to the present teachings are provided below.

Definitions:

$$eV = 1.602 \cdot 10^{-19} \cdot J$$

$$keV = 1 \cdot 10^3 \cdot eV$$

$$q = 1.6 \cdot 10^{-19} \cdot C$$

Outer cylinder radius ($r_o$), inner cylinder radius ($r_i$), cylinder height (L).

$$r_{bar} = \frac{(r_o + r_i)}{2}$$

$$\Delta r = r_o - r_i$$

Focal point of a cylinder ESA: $\frac{\pi}{\sqrt{2}} = 127.279$ deg

Pitch angle of particle spiral trajectory that exits cylinders at focal point:

$$\gamma = \operatorname{atan}\left(\frac{\pi}{\sqrt{2}} \cdot \frac{r_{bar}}{L}\right)$$

Analyzer constant (ratio of particle energy to cylindrical electric field):

$$\eta = \frac{1}{\ln\left(\frac{r_o}{r_i}\right) \cdot \sin(\gamma)^2}$$

Electric field between cylinders to select energy ($E_v$):

$$\phi_{defl} = \frac{(2 \cdot E_v)}{q \cdot \eta}$$

For an ESA, ΔE/E (energy bandwidth) is a function of the aperture dimensions and the average radii of the cylinders. More particularly, the energy bandwidth may be dependent on the number, position, and geometry of the apertures. That is, the energy bandwidth is generally a function of this geometry, but it is independent of the energy channel selected.

ESAs as described herein may be used in a spaceflight environment, as these ESAs may address one or more needs of the operational spaceflight environment, including without limitation: having a relatively compact size, having a relatively high analyzer constant, having a relatively low weight, using relatively low power, having a relatively large geometric factor, having multiple collimated fields of view, including solar light rejection, having a relatively long service life, having a relatively high temporal resolution, and being relatively easy to perform tuning. Thus, an ESA as described herein may be used for spaceflight environmental energetic particle monitoring. Also, or instead, an ESA as described herein may be used as an element of ground laboratory test systems including, but not limited to, mass spectrometry and medical radiation therapy. Therefore, although an ESA as described herein may be primarily designed to be used as a charged particle detector for use in space, it will be understood that an ESA as described herein may also or instead have applications in scientific laboratories or radiation therapy (e.g., as an energy filter or mass spectrometer for charged particles).

In use, the apertures or openings of the ESA should be positioned so as to capture particles directed towards the ESA. These particles may then be permitted to travel through the ESA analyzer plates, which may pass the particles having the appropriate energy through the analyzer and cause other particles to impact the walls. Charge multipliers in the ESA may collect the particles and amplify the signal in order to produce a measurable current pulse. The bias applied to the analyzer plates may be variable and controlled by controller (e.g., a microcontroller or similar device) so that any number of particle energies can be selected. This bias control may also or instead be programmable, e.g., via commands relayed from a user (e.g., to a host spacecraft, and then to the ESA). The energy value and dwell time of a measurement may be determined based on the spacecraft environment. Charged particle detections during a measurement period for a given energy may be counted, recorded, formatted (e.g., into data packets or the like), and transmitted from the ESA to a user, e.g., via a spacecraft telemetry system and associated ground support elements.

As discussed herein, one or more components of the ESA may be 3D printed or otherwise manufactured using additive manufacturing technology. For example, the entrance filters, and the notch-and-vane coaxial cylinder design can be produced using additive manufacturing techniques. One or more components of the ESA may also or instead be produced using high-end machining processes and/or mold casting.

An ESA as described herein may be adaptable for specific purposes or design parameters. For example, the height and radii of the cylinders may be specifically configured for a predetermined purpose. Also, or instead, one or more of the angle, size, and shape of the openings of the entrance filter, as well as the number of openings, can be configured for a specific purpose. Further, a number or type of charge multipliers may be adjusted to match the performance characteristics desired for an ESA. For example, the size, shape, and other physical characteristics of charge multipliers may be specifically tailored for a particular application. By way of example, a charge multiplier may be placed at the center of the cylinders or some other location (a location without an entrance aperture) to act as a background detector. In general, the cylinders may be made of an electrically conductive material to provide electrical conductivity, and insulating endcaps may be included for mounting the ESA (e.g., in certain implementation, the endcaps or housing should be highly insulating to prevent current leakage and/or voltage breakdown).

As discussed herein, an ESA may include UV mitigation. This may include a notch-and-vane design or a cylindrical design with dissipative material dividers/baffles placed in-between charge multiplier channels. The material used may be resistive to avoid current leakage and breakdown, but also static dissipative to prevent charge build-up that can cause deformation of the electric fields of the analyzer and potential arcs.

Another configuration of an ESA as described herein includes a nested double ESA design for detecting both electrons and ions. For example, an ESA may include three cylinders, e.g., with the middle cylinder serving as one of the analyzer plates. Here, the use of a static dissipative material as physical dividers between individual field of view directions could also or instead provide a reduction in scattered photons. Thus, in an alternate embodiment, an ESA may include a third conductive cylinder, where the third conductive cylinder is disposed within the inner conductive cylinder, and where the third conductive cylinder is structurally configured to serve as an analyzer plate for the ESA.

Further, an ESA as described herein may generally include a housing and one or more pathways extending from a first end of the housing to a second end of the housing, where the pathways are structurally configured to allow, therethrough, a passage of charged particles having a predetermined energy/charge band. The ESA may also include one or more entrance filters on the first end of the housing disposed between a pathway and an external environment. An entrance filter may define a plurality of openings aligned at a predetermined angle thereby limiting one or more fields of view between a pathway and the external environment to filter particles, by their trajectory, from entering the pathway for analysis by the ESA.

Figure 8:
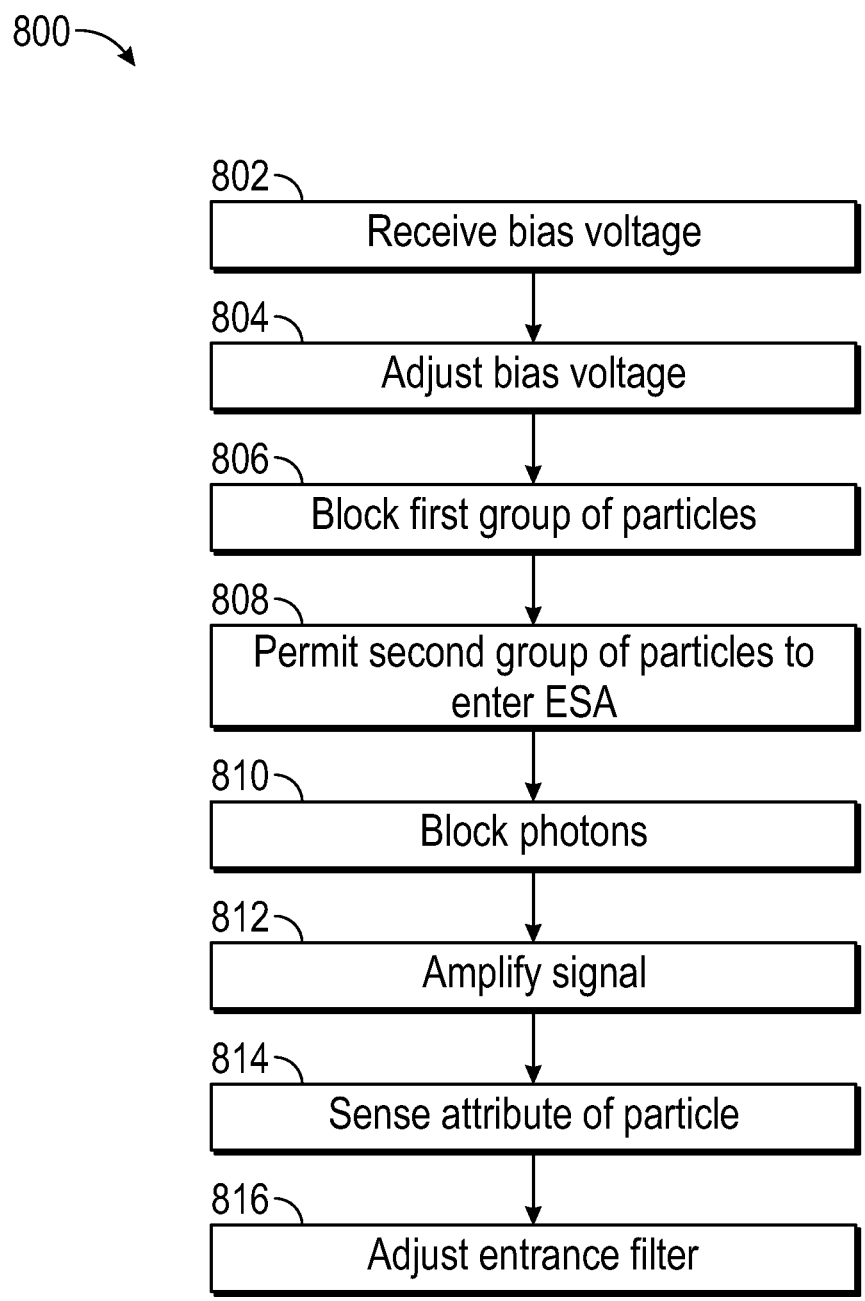
FIG. 8 is a flow chart of a method for analyzing charged particles, in accordance with a representative embodiment.

FIG. 8 is a flow chart of a method 800 for analyzing charged particles, in accordance with a representative embodiment. The method 800 may include the use of one or more of the ESAs (or systems containing the ESAs) as described herein. For example, one or more of the ESAs as described herein may perform the method 800.

As shown in block 802, the method 800 may include receiving a bias voltage at one or more of an outer conductive cylinder and an inner conductive cylinder of an ESA (e.g., both the outer conductive cylinder and inner conductive cylinder).

As shown in block 804, the method 800 may include adjusting the bias voltage applied to one or more of the outer conductive cylinder and the inner conductive cylinder, e.g., using a controller or the like.

As shown in block 806, the method 800 may include blocking a first group of charged particles having a first trajectory from entering the ESA using an entrance filter disposed on a first end of the ESA. The entrance filter may define one or more openings disposed at a predetermined angle.

As shown in block 808, the method 800 may include permitting a second group of charged particles to enter the ESA through the entrance filter. The second group of charged particles may have a second trajectory that is different from the first trajectory of the first group of charged particles that is blocked from entering the ESA using the entrance filter. To this end, the predetermined angle of one or more of the openings may thus be substantially aligned with the second trajectory.

As shown in block 810, the method 800 may include blocking photons. Photons may be blocked, for example, using walls of a channel that defines the pathway for one or more particles of the second group of charged particles to travel through the ESA. Also, or instead, photons may be blocked using one or more baffles that define a pathway for one or more particles of the second group of charged particles to travel through the ESA.

As shown in block 812, the method 800 may include amplifying a signal pertaining to a particle or an attribute of the particle. It will be understood that a charge multiplier or the like may be used to this end.

As shown in block 814, the method 800 may include sensing an attribute of one or more particles of the second group of charged particles that travel through a pathway disposed between the outer conductive cylinder and the inner conductive cylinder to a second end of the ESA. It will be understood that sensing an attribute may include filtering based on the kinetic energy and charge of the particles. Thus, in this manner, sensing an attribute may simply include detecting the particles that are filtered according to their energy and charge.

As shown in block 816, the method 800 may include adjusting the entrance filter to change the predetermined angle of one or more of the openings. Thus may include removing and replacing the entrance filter.

Environmental Sensor

As discussed above, the present teachings may include an environmental sensor structurally configured to measure over a wide range of incident particle energy and flux. In addition, the present teachings may include an environmental sensor that possesses background rejection in an improved manner. Moreover, the present teachings may include an environmental sensor that has better channel resolution compared to prior sensors, and that provides the capability to dynamically adjust the energy channel ranges that are being used. This may provide the environmental sensor with the capability to tune a channel to a specific energy range for predicting repetitive anomalies associated with specific space environment conditions. An environmental sensor according to the present teachings may thus be intended to make measurements directly proportional to incident particle flux versus energy, which may be the fundamental driver for radiation effects. By having a focus on flux measurements, radiation transport models can then be used to assess radiation effects in components at different locations in a space vehicle at different shielding depths. In addition, flux measurements may be best suited for translation from a current space vehicle location to another space vehicle that may not have a local sensor via geophysical models. An environmental sensor according to the present teachings may be able to provide data with sufficient accuracy for anomaly resolution over a wide range of possible stressing scenarios. And the environmental sensor may do this while retaining a relatively low mass, a relatively small size, a relatively low power dissipation, and the sensor may utilize few command and telemetry resources.

An environmental sensor according to the present teachings may have a plurality of configurations (e.g., at least two different configurations) that allow for look directions for its individual sensors to be optimized for almost any orbit. Further, an environmental sensor according to the present teachings (and its associated electronics) may be hardened to meet long duration missions in earth orbit or otherwise —this includes radiation hardiness and reliability.

Therefore, an environmental sensor according to the present teachings may be structurally configured for anomaly attribution due to the space radiation environment. The environmental sensor may accomplish this using solid-state particle telescopes structurally configured to measure proton and electron fluxes (the drivers for three of four primary space environment effects—event total dose, deep dielectric charging, and single event effects). These telescopes may be integrated into a relatively compact package, with space reserved for an ESA as described herein (thereby covering the fourth primary space environment effect—surface charging). The sensors themselves may measure a wide dynamic range in particle flux, provide high energy resolution, have improved out-of-band contamination rejection, and improved diagnostic capability compared to other instruments.

An environmental sensor according to the present teachings may thus provide measurements for rapid anomaly attribution without the need for experts to interpret the data being produced by the environmental sensor. Measurements from the environmental sensor may be reliable over a wide range of environmental conditions in addition to having sufficient energy coverage and channel spacing. In particular, the environmental sensor may be robust against cross-contamination by out-of-band particles and may provide information that can be used to assess data quality. The environmental sensor may measure high levels of flux (e.g., from a median level to at least 99% flux levels) that are likely to cause anomalies without saturation. Also, the environmental sensor may include relatively low levels of size, weight, power, and telemetry, e.g., compared to a host satellite.

Figure 9:
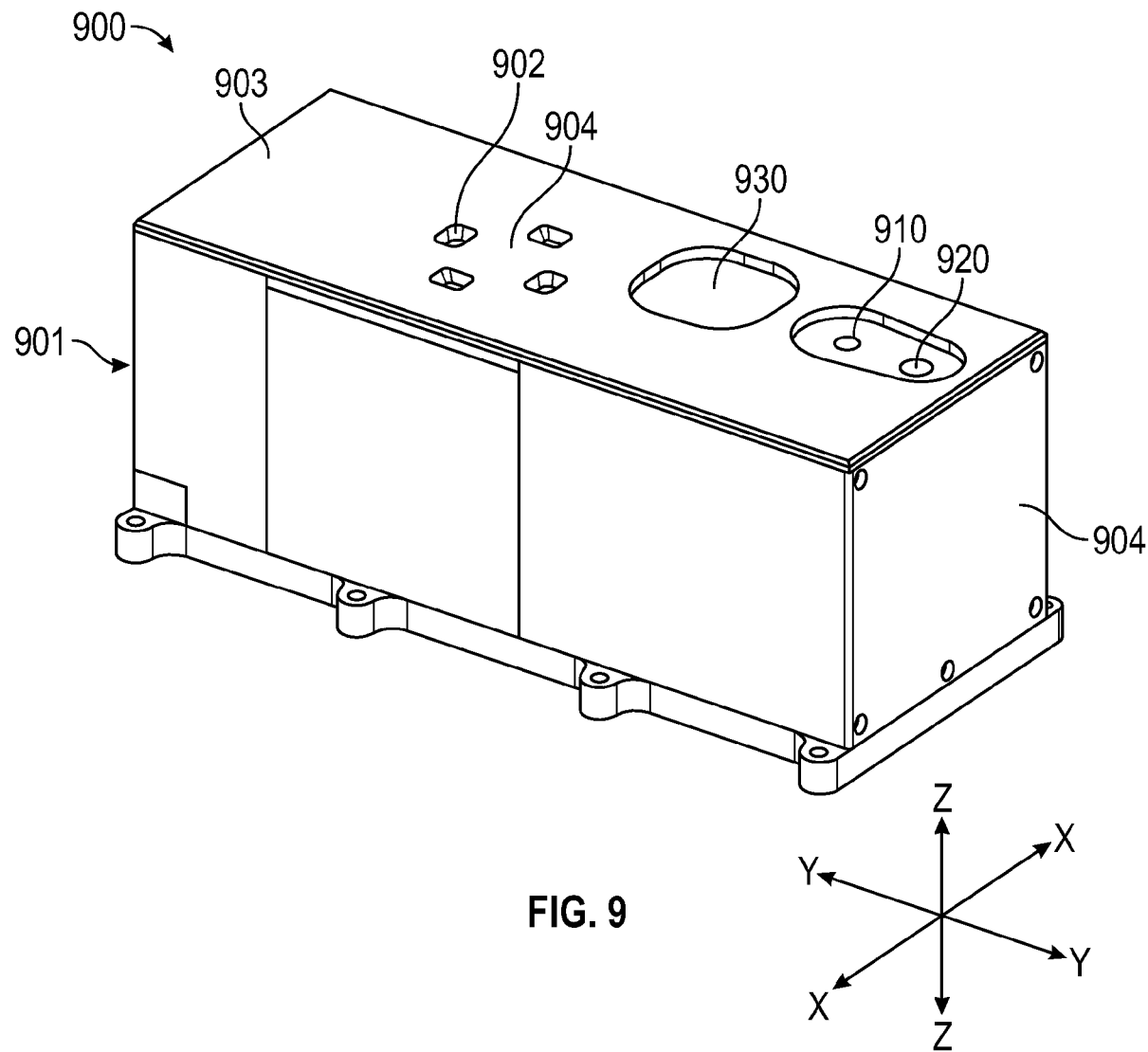
FIG. 9 illustrates an environmental sensor, in accordance with a representative embodiment.
Figure 10:
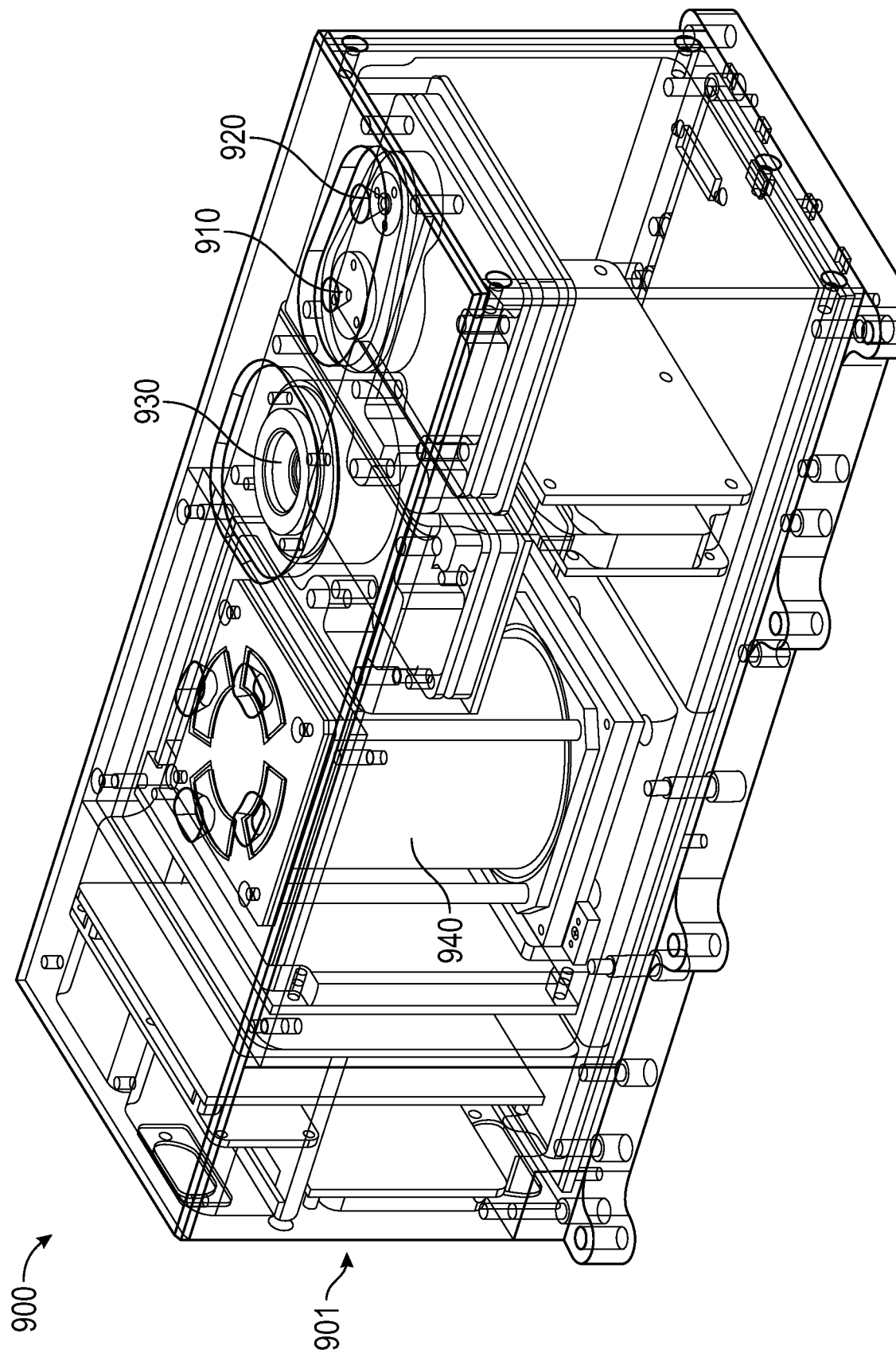
FIG. 10 illustrates a transparent view of an environmental sensor showing various internal components, in accordance with a representative embodiment.
Figure 11:
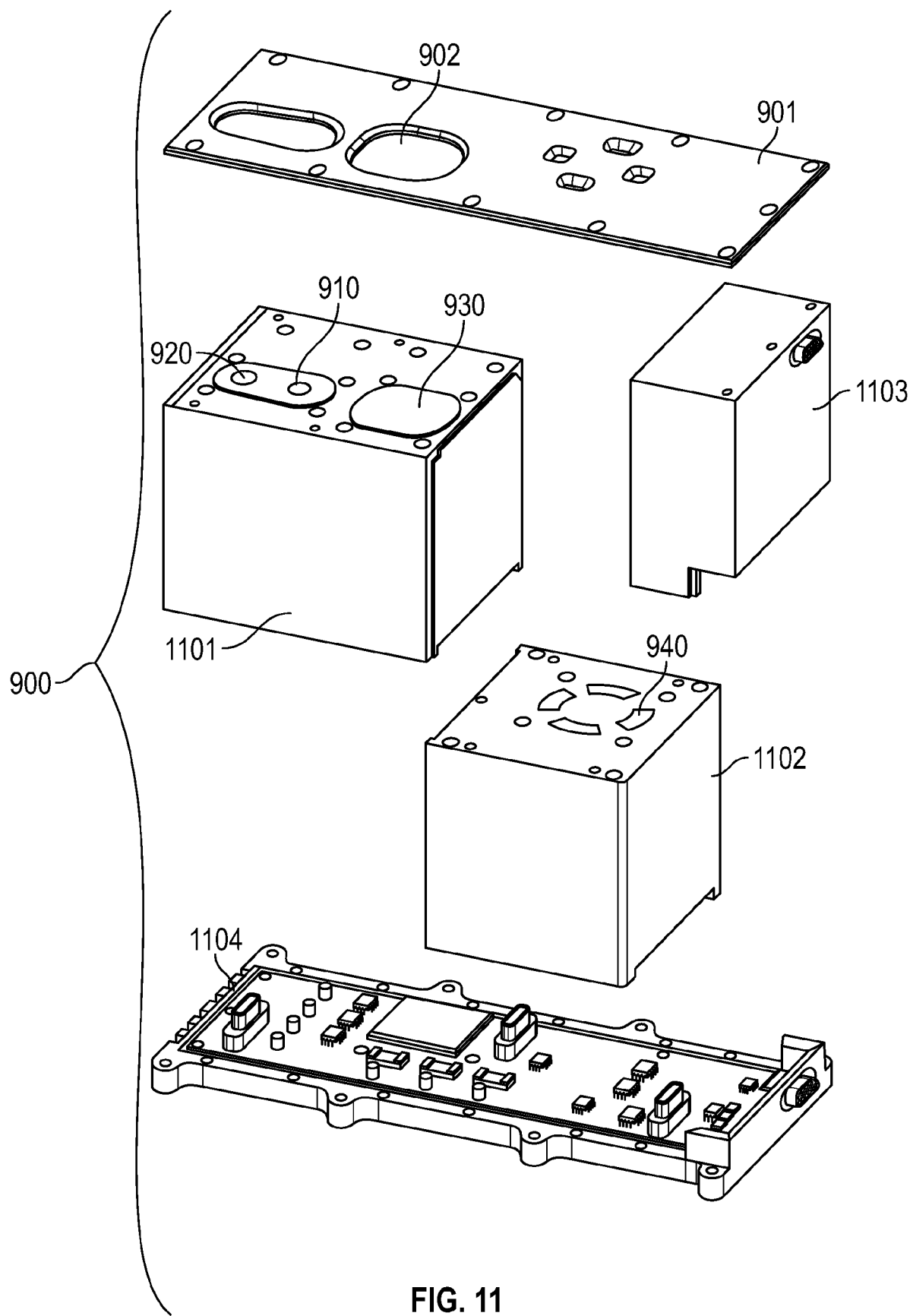
FIG. 11 illustrates an exploded view of an environmental sensor, in accordance with a representative embodiment.

FIGS. 9-11 show an environmental sensor 900 in accordance with a representative embodiment. Specifically, FIG. 9 illustrates an environmental sensor 900, FIG. 10 illustrates a transparent view of the environmental sensor 900 showing various internal components, and FIG. 11 illustrates an exploded view of the environmental sensor 900. The environmental sensor 900 may be structurally configured for acquiring data related to flux and energy of charged particles in an environment for using the data to determine, in substantially real time, whether the environment is conducive to an anomaly caused by the charged particles. The charged particles detected and measured by the environmental sensor 900 may include one or more of (i) low-energy protons, (ii) high-energy protons, (iii) low-energy electrons, (iv) high-energy electrons, and (v) high-energy ions.

Although shown as a standalone device in these figures, the environmental sensor 900 may be included as part of a system, such as the system 109 shown and described above with reference to FIG. 1. Thus, any of the components of that system 109 (or other systems as described herein) may be included as part of the environmental sensor 900, or may work in conjunction with the environmental sensor 900.

The environmental sensor 900 may be structurally configured to characterize a local space environment's energetic proton and electron fluxes over a wide range of energies. A focus of the environmental sensor 900 may be on measuring proton and electron fluxes associated with four major types of space environmental hazards: (1) total event dose, (2) single event effects, (3) deep-dielectric charging, and (4) surface charging. The environmental sensor 900 may include enhanced capabilities compared to other sensors, e.g., in regard to channel type and coverage (e.g., more channels, channel programmability, and differential with respect to energy), dynamic range in flux, less sensitivity to background contamination, and relative ease of manufacture.

Turning back to FIGS. 9-11, in general, the environmental sensor 900 may include an ESA 940 (such as any of those as described herein) structurally configured for charged particle detection, and a plurality of silicon detector telescopes structurally configured to collectively detect electrons having energy within the range of about 100 electronvolts (eV) to about 5 mega-electronvolts (MeV) and to collectively detect protons having energy within the range of about 2 MeV to about 100 MeV (it will be understood that any and all ranges of values described herein shall be inclusive of their outer limits/values unless explicitly stated to the contrary or otherwise clear from the context). More specifically, the environmental sensor 900 may include a plurality of silicon detector telescopes including a low energy proton electron telescope (LEPET 910), a medium energy proton electron telescope (MEPET 920), and a high energy proton electron telescope (HEPET 930), e.g., where the LEPET 910, MEPET 920, and the HEPET 930 each include a multitude of silicon detectors.

The LEPET 910 may be structurally configured to detect and measure electrons having energy within the range of about 0.1 MeV to about 0.5 MeV and protons having energy within the range of about 2.0 MeV to about 8.0 MeV. The electron data provided by the LEPET 910 may be used for predicting/detecting anomaly attribution for deep dielectric charging in lightly shielded enclosures as well as total event dose. The proton data provided by the LEPET 910 may be used to predict/detect total event dose for lightly shielded components as well as being used for displacement damage analysis. The LEPET 910 may use a spectrum of counts versus energy deposited to determine the incident electron and proton fluxes in an environment. Using the LEPET 910, primary energy channels may be formed by summing adjacent bins within a detailed histogram that can be used for rapid data analysis. In addition, detailed histogram data may be provided from the LEPET 910 (or, more generally, from the environmental sensor 900) for detailed analysis of an environment as well as for diagnostic purposes. The primary channels may be modified as the performance of the LEPET 910 (or, more generally, the performance of the environmental sensor 900) changes, e.g., due to aging, environmental conditions, or cross-calibrations with other on-orbit instruments. In addition, dynamic adjustment of the channels may enable tuning of environmental drivers for recurring anomalies associated with a space environment.

The MEPET 920 may be structurally configured to detect and measure electrons having energy within the range of about 0.5 MeV to about 1.7 MeV and protons having energy within the range of about 8.0 MeV to about 18.0 MeV. In certain implementations, the LEPET 910 and the MEPET 920 may be similar to one another. Some specific differences that may be present between the LEPET 910 and the MEPET 920 may include the thickness of the silicon detectors, the presence of a degrader (e.g., an aluminum foil degrader) on the MEPET 920, and the use of a collimator with a larger aperture on the MEPET 920. These differences in the MEPET 920 relative to the LEPET 910 may be used to tune the environmental sensor 900 to the particular energy range and fluxes at those energies. For example, the thicker foil may establish a lower energy cutoff for particles that can enter the particular telescope; the thicker silicon detector (e.g., the first silicon detector in the MEPET 920) may enable measurement of a wider range of energy deposits by incident particles; and a larger aperture may allow for greater sensitivity to lower flux levels that are associated with higher energy particles (because of their greater energy, the flux may be substantially less, e.g., about one-tenth of that for LEPET 910). Similar to LEPET 910, the MEPET 920 may use a spectrum of counts versus energy deposited to determine incident electron and proton fluxes. Also, similar to LEPET 910, using the MEPET 920, primary energy channels may be formed by summing adjacent bins within a detailed histogram that can be used for rapid data analysis.

Thus, one or more of the LEPET 910 and the MEPET 920 may include primary energy channels formed by summing bins within a histogram for data analysis. In certain implementations, the primary energy channels are adjustable. For example, the primary energy channels may be dynamically adjustable for tuning of environmental drivers for recurring anomalies.

The HEPET 930 may be structurally configured to detect and measure electrons having energy within the range of about 1.5 MeV to about 5.0 MeV and protons having energy within the range of about 15.0 MeV to about 100.0 MeV. The electron measurements from the HEPET 930 may be provided for predicting/detecting deep dielectric charging, and the proton measurements from the HEPET 930 may be provided for predicting/detecting single event effects. In addition, the data from the HEPET 930 may be used for analysis of the data from the LEPET 910 and the MEPET 920. This can be particularly useful under certain conditions where the high energy proton flux is comparable or greater to the low energy proton flux that the LEPET 910 and the MEPET 920 may be intended to measure.

In general, one or more of the LEPET 910, the MEPET 920, and the HEPET 930 may be structurally configured to use a spectrum of counts versus energy deposited to determine incident electron and proton fluxes. Also, or instead, one or more of the LEPET 910, the MEPET 920, and the HEPET 930 may be structurally configured to generate histogram data to analyze one or more of the environment, a calibration, and diagnostics.

One or more of the LEPET 910, the MEPET 920, and the HEPET 930 may include a collimator that defines a field of view and provides a shielding to limit count rates to a predetermined level in order to conduct pulse processing. Also, or instead, there may be another type of shielding provided on one or more of the LEPET 910, the MEPET 920, and the HEPET 930—for example, one or more of these instruments may include a tungsten or aluminum shielding thereon. Such shielding may provide low energy cutoffs for incident particles.

As discussed above, the ESA 940 may be the same or similar to any of those as described herein, such as those described with reference to FIGS. 1-8 above. The ESA 940 may be structurally configured for charged particle detection, where the ESA 940 generates controllable electric fields to provide energy filtering of incoming charged particles. After filtering, the charged particles may impact a charge multiplier to establish a detectable signal. The ESA 940 may include two conductive cylinders coaxially aligned, with a first cylinder placed at least partially inside a second cylinder. Each cylinder may include an electrical terminal to apply a bias voltage thereto, and to establish electric field(s).

The environmental sensor 900 may include a housing 901, where the components of the environmental sensor 900 (e.g., the LEPET 910, the MEPET 920, the HEPET 930, and the ESA 940) are contained at least partially therein (e.g., wholly therein) in a predetermined configuration. The housing 901 may include one or more apertures 902 that provide a field of view for the components of the environmental sensor 900, e.g., each component may have its own aperture 902 or set of apertures 902 (e.g., the ESA 940 may include at least four apertures 902, one for each viewing angle of the ESA 940). By way of example, the components of the environmental sensor 900 may be aligned or configured such that all of the components are facing a z-direction. Thus, all of the apertures 902 may be included on a top panel 903 of the housing 901. In other implementations, one or more of the components of the environmental sensor 900 may be aligned or configured such that they are facing an x-direction or a y-direction, and thus, one or more of the apertures 902 may be included on a side panel 904 of the housing 901. By way of example, apertures 902 for the ESA 940 may face an x-direction. Also, or instead, power and signal connectors may be disposed on a side panel 904 of the housing 901. In this manner, the housing 901 may be mountable along a z-axis direction (although other mounting configurations, and other component configurations are also or instead possible).

Further to the configuration of the individual components or instruments of the environmental sensor 900, FIG. 11 shows how the environmental sensor 900 may be configured in modules. Specifically, as shown in FIG. 11, the environmental sensor 900 may include the top panel 903 having apertures 902 for the instruments contained therein as discussed above, a first module 1101, a second module 1102, a third module 1103, and a base 1104 containing other hardware and electronics for the environmental sensor 900. The first module 1101 may include one or more of the silicon detector telescopes—e.g., each of the LEPET 910, the MEPET 920, and the HEPET 930. The second module 1102 may include the ESA 940. The third module 1103 may include a power source or the like therein, and may thus be considered a power module or the like. Housing components of the environmental sensor 900 in modules may allow each component to have individual shielding and instruments (e.g., collimators, preamplifiers, pulse shaping circuitry, and so on).

In certain implementations, the structural and shielding components of the environmental sensor 900 are manufactured using typical machining techniques (e.g., milling, drilling, lathing, and so on). In some implementations, as explained herein, the cylinders and entrance apertures of the ESA 940 may be manufactured using direct metal laser sintering (DMLS) technology or similar. Also, or instead, one or more of the apertures 902 may be produced using a five-axis computer numerical control (CNC) milling machine, or a traditional milling machine. In certain implementations, standard commercially available plating and coatings may be applied on corrosion susceptible materials or optical sensitive components.

As discussed above, the base 1104 or another portion of the environmental sensor 900 may include various electronics. For example, the electronics may include circuit card assemblies populated on a mix of traditional printed wiring boards (PWB) and rigid-flex PWBs. The electrical components may include off-the-shelf components, or custom components such as custom transformers or the like. Further, the firmware and software instantiated on the instrument may be custom written. Assembly and storage of the environmental sensor 900 may be conducted in a cleanroom environment, e.g., due to its scientific and space-flight applications.

The environmental sensor 900 may be designed for use on a spacecraft bus. In order for the bus to accommodate the environmental sensor 900, in some implementations, designers of a spacecraft should comply with specific interface specifications. Because the environmental sensor 900 may be designed for use in space, the materials used for the environmental sensor 900 may be selected to meet a specific set of radiation shielding, mass limiting, and structural requirements. If the requirements for a specific application are different, other materials may be chosen that do not impact functionality. For instance, a titanium alloy may be used for construction of the cylinders of the ESA 940; however, if mass is not a restriction, a denser alloy of copper could be used. By way of another example, other dense metals (e.g., gold or a tungsten alloy, or even brass) can be used for collimators (e.g., instead of a platinum alloy), where this change would likely have a minimal impact on performance. In certain implementations, changes to the diameter or length of the collimators of the silicon detectors affect the performance of the environmental sensor 900, but not its functionality. The same may be said for the length or diameter of the cylinders of the ESA 940, or the size and orientation of the entrance apertures for the ESA 940.

Having described an environmental sensor 900 generally, examples of each component of the environmental sensor 900 will now be discussed.

Figure 12:
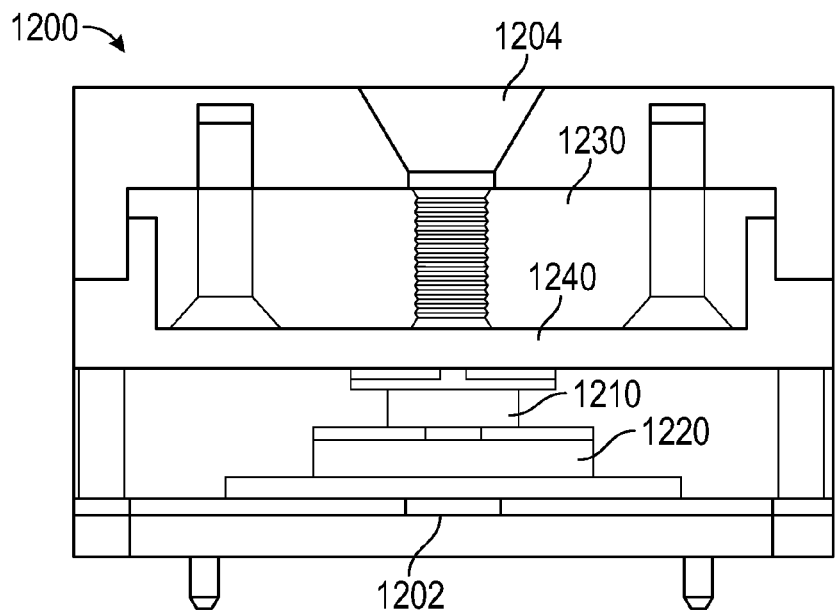
FIG. 12 illustrates a cross-sectional view of a low energy proton electron telescope (LEPET), in accordance with a representative embodiment.
Figure 13:
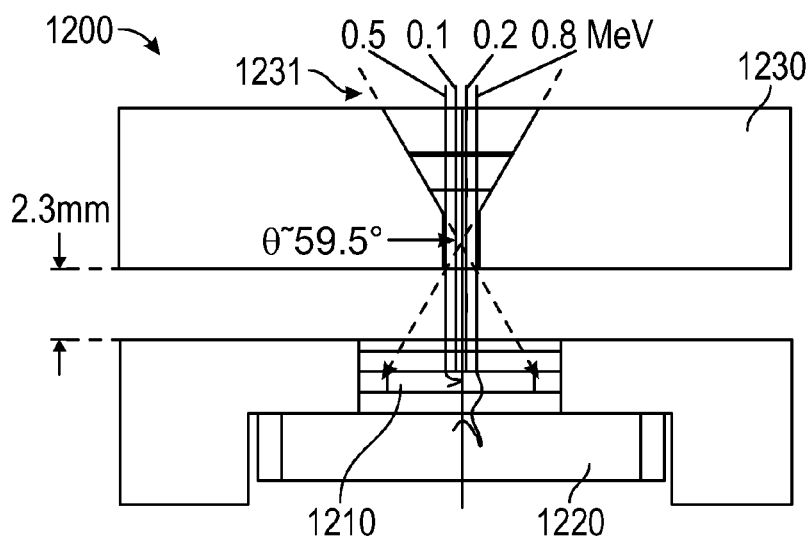
FIG. 13 illustrates a representation of a LEPET detecting electrons, in accordance with a representative embodiment.
Figure 14:
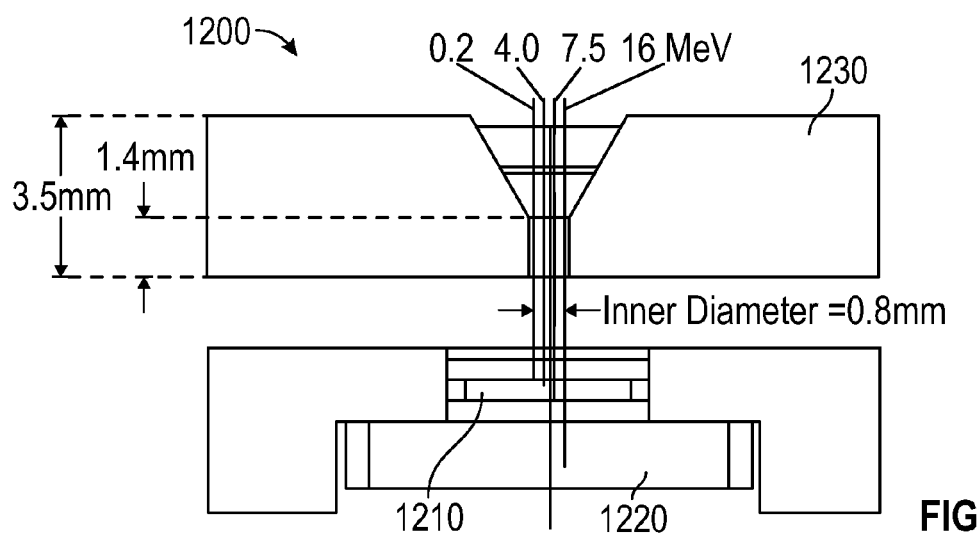
FIG. 14 illustrates a representation of a LEPET detecting protons, in accordance with a representative embodiment.

FIG. 12 shows an example of an LEPET 1200 individually in cross-section, and FIGS. 13 and 14 show how the LEPET 1200 detects electrons and protons, respectfully. As shown in these figures, the LEPET 1200 may include a first silicon detector 1210, a second silicon detector 1220, a collimator 1230, and shielding 1240.

Thus, the LEPET 1200 may include at least two distinct ion-implanted silicon detectors—the first silicon detector 1210 (which may be the front sensor of the LEPET 1200) and the second silicon detector 1220 (which may be the back sensor of the LEPET 1200). In certain implementations, the first silicon detector 1210 includes a ~430-μm ion-implanted silicon detector and the second silicon detector 1220 includes a ~1500-μm ion-implanted silicon detector. It will be understood, however, that a range of thicknesses and separations are possible, depending upon what energy level is to be detected and measured. The thicknesses of the silicon detectors may be integral for tailoring the LEPET 1200 to a specific environment and for data to be collected from the environment. The silicon detectors of the LEPET 1200 (e.g., the first silicon detector 1210 and the second silicon detector 1220) may be stacked substantially coaxially, and may be reverse-biased diodes that are structurally configured to be operated such that a depletion region extends to a full thickness of each silicon detector.

In use, incident particles that deposit energy in the first silicon detector 1210, but do not deposit enough energy to trigger a comparator circuit 1202 for the second silicon detector 1220 within an adjustable anticoincidence window (e.g., where the anticoincidence window is about 1-μs), may be binned according to the energy deposited (e.g., into one of 1024 bins). Further, particles that penetrate the first silicon detector 1210 may not be counted in an energy histogram because these particles will trigger an energy deposit in the second silicon detector 1220. In addition to the histogram data, single counters for each silicon detector may record every event that is above an adjustable threshold. In this manner, one or more of the silicon detectors (e.g., each of the silicon detectors) may include a counter that records events above a predetermined threshold, e.g., an adjustable predetermined threshold. Thus, the LEPET 1200 may include a comparator circuit 1202 that is triggered whenever energy is deposited in the back detector (e.g., the second silicon detector 1220), e.g., independent of whether or not another silicon detector (e.g., the first silicon detector 1210) is triggered. In this manner, for in-view particles, both silicon detectors may have deposited energy when the comparator circuit 1202 is triggered.

As best shown in FIGS. 13 and 14, the collimator 1230 may define a field of view 1231 for the LEPET 1200. The collimator 1230 may also or instead provide shielding to limit count rates to a predetermined level in order to conduct pulse processing. The collimator 1230 may include a nonmagnetic metal having a density greater than about 16-grams per cubic centimeter. For example, the collimator 1230 may include platinum or tungsten. The walls of the collimator 1230 may be lined to reduce scattering of electrons and better define the look direction of the LEPET 1200.

In certain implementations, the collimator 1230 is made from a platinum alloy or similar, and the LEPET 1200 includes shielding 1240 made from tungsten or similar. In general, the shielding 1240 may encase the LEPET 1200. The shielding 1240 may also or instead establish the LEPET 1200 as solar blind. The shielding 1240 may also or instead provide low energy cutoffs of about 840 keV for protons and about 40 keV for electrons. For example, the first silicon detector 1210 may be coated with about 10-μm of aluminum (or the like) to make the detector solar blind as well as to provide low energy cutoffs of about 840 keV for protons and about 40 keV for electrons. The remaining surfaces of the first silicon detector 1210, as well as the surfaces of the second silicon detector 1220, may be coated with about 4-μm of aluminum (or the like) to ensure that they are blind to solar UV as well.

Thus, a platinum alloy collimator 1230 may define the field of view 1231 and provide sufficient shielding to limit count rates to manageable levels for the electronics of the LEPET 1200 to conduct the pulse processing. In addition, a tungsten and/or aluminum shielding 1240 may surround the LEPET 1200 sensor on all sides, other than the LEPET aperture 1204, to reduce background count rates. The LEPET aperture 1204 may be open to space.

It will be understood that, although certain ranges of values and certain dimensions are shown in FIGS. 13 and 14, these are provided by way of example only, and other dimensions and ranges of values are also or instead possible.

Figure 15:
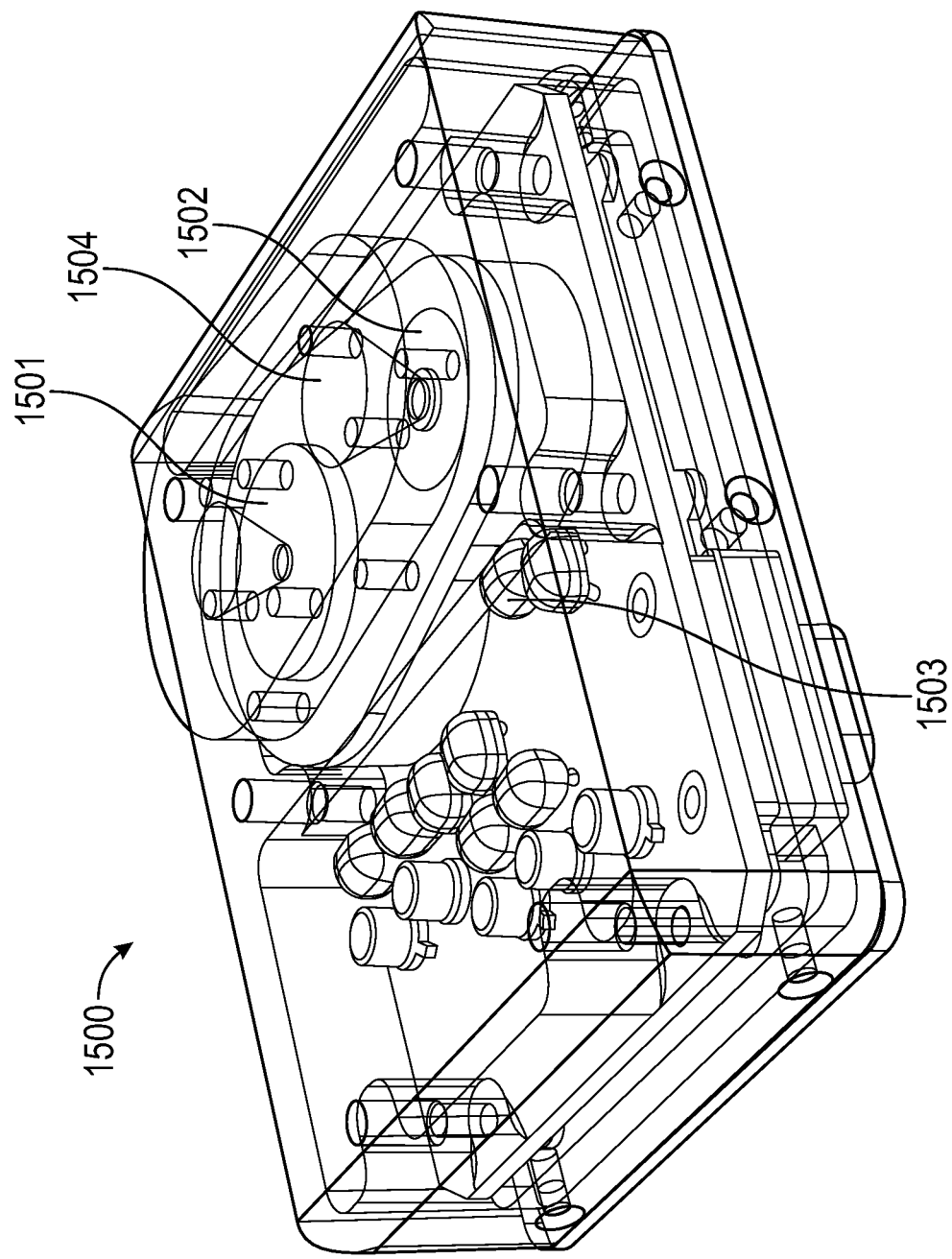
FIG. 15 illustrates a transparent view of a module housing proton electron telescopes, in accordance with a representative embodiment.
Figure 16:
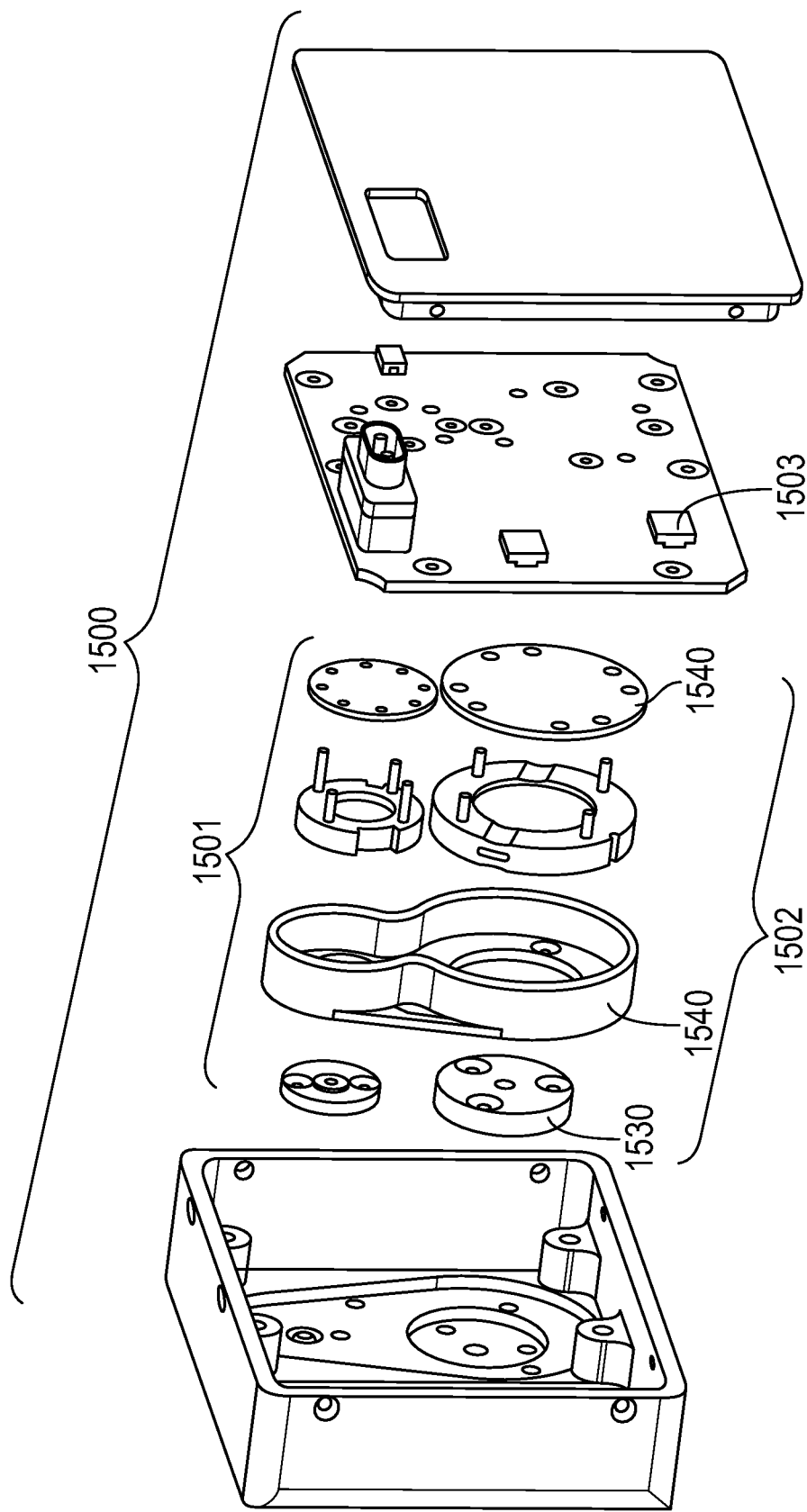
FIG. 16 illustrates an exploded view of a module housing a LEPET and a medium energy proton electron telescope (MEPET), in accordance with a representative embodiment.
Figure 17:
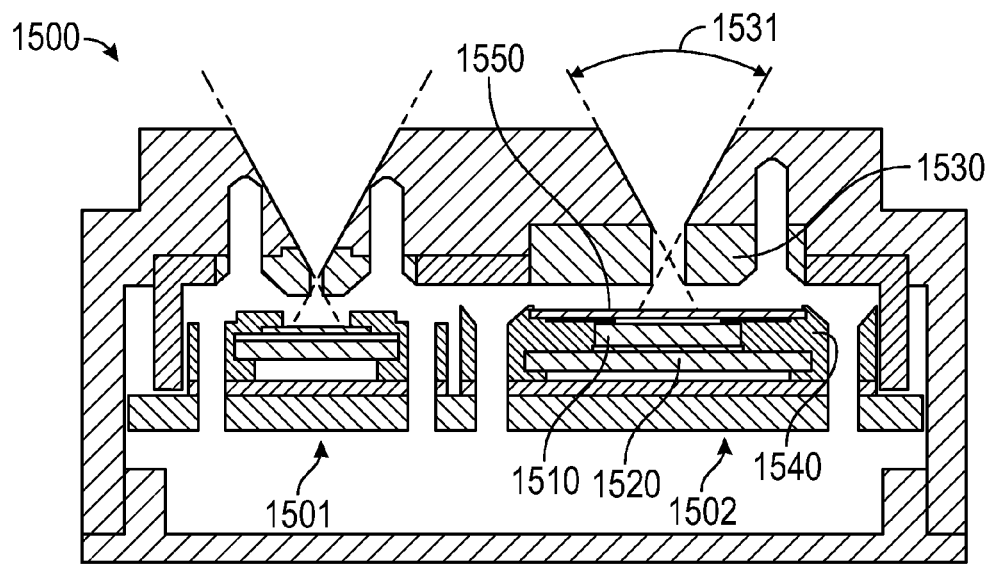
FIG. 17 illustrates a cross-sectional view of a module housing a LEPET and a MEPET, in accordance with a representative embodiment.

FIGS. 15-17 show a module 1500 housing a plurality of silicon detector telescopes, in accordance with representative embodiments. Specifically, FIG. 15 illustrates a transparent view of a module 1500 housing at least a LEPET 1501 and a MEPET 1502, FIG. 16 illustrates an exploded view of a module 1500 housing a LEPET 1501 and a MEPET 1502, and FIG. 17 illustrates a cross-sectional view of a module 1500 housing a LEPET 1501 and a MEPET 1502. Further, FIG. 18 illustrates a representation of a MEPET 1502 detecting electrons, and FIG. 19 illustrates a representation of a MEPET 1502 detecting protons, in accordance with a representative embodiment.

A described herein, the MEPET 1502 may be structurally configured to detect and measure electrons having energy within the range of about 0.5 MeV to about 1.7 MeV and protons having energy within the range of about 8.0 MeV to about 18.0 MeV. Similar to the LEPET 1501, the MEPET 1502 may include at least two ion-implanted silicon detectors—e.g., a first silicon detector 1510 (front detector) and a second silicon detector 1520 (back detector). The MEPET 1502 may further include a collimator 1530 and shielding 1540. In general, the MEPET 1502 may have the same or a similar configuration to the LEPET 1501 (e.g., any of the LEPETs described herein), and may thus operate in the same or a similar fashion. However, some particular differences between the LEPET 1501 and the MEPET 1502 may include the thickness of the silicon detectors, the presence of a degrader 1550 (e.g., an aluminum foil degrader) on the MEPET 1502, and the use of a collimator 1530 with a larger aperture on the MEPET 1502.

As discussed above, the MEPET 1502 may include two ion-implanted silicon detectors. Specifically, in certain implementations, the MEPET 1502 may two ~1500-μm thick ion-implanted circular silicon detectors stacked coaxially on top of each other. In use, particles that deposit energy into the first silicon detector 1510 (front detector) but do not trigger a pulse within a predetermined anticoincidence window (e.g., an anticoincidence window of about 1-μs) in the second silicon detector 1520 (back detector) may be binned according to energy deposited (e.g., their peak height), e.g., into one of 1024 bins. This may form the histogram data that the MEPET 1502 collects. In addition to the histogram data, single counters for each detector may record every event that is above a specified threshold. Stated otherwise, each of the silicon detectors may include a counter that records events above a predetermined threshold.

Figure 18:
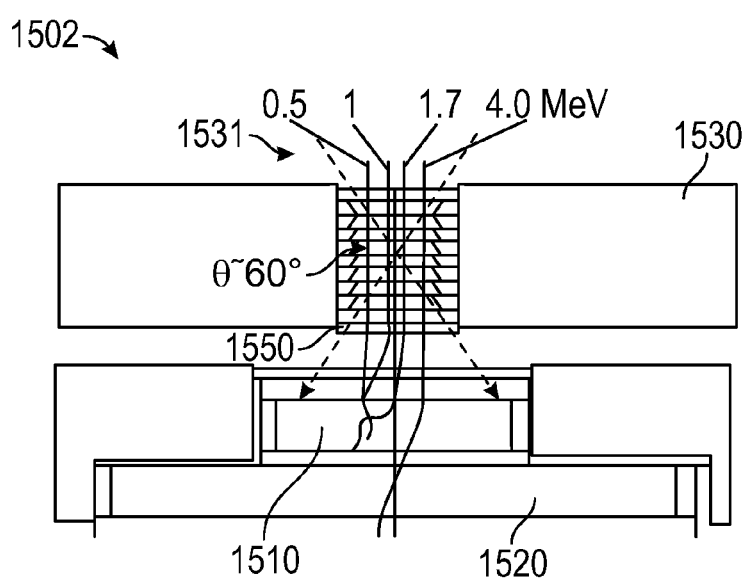
FIG. 18 illustrates a representation of a MEPET detecting electrons, in accordance with a representative embodiment.
Figure 19:
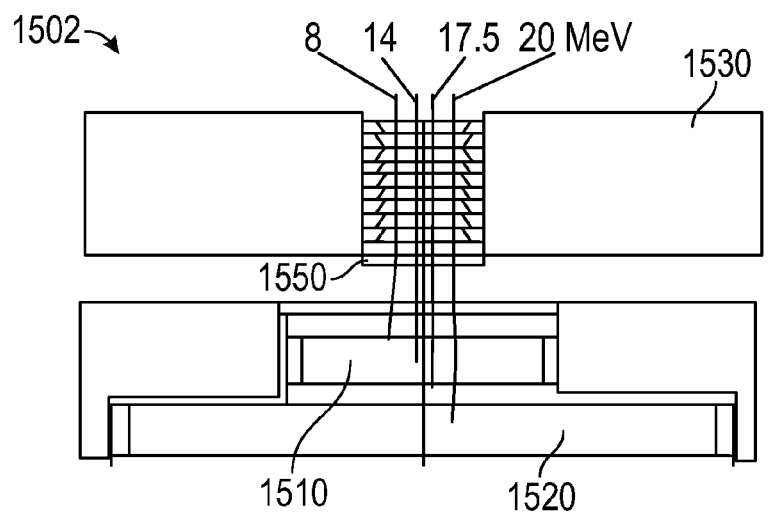
FIG. 19 illustrates a representation of a MEPET detecting protons, in accordance with a representative embodiment.

As shown, e.g., in FIGS. 17-19, the MEPET 1502 may include a collimator 1530 and shielding 1540. The collimator 1530 may include a high density alloy such as platinum, tungsten, and the like. The collimator 1530 may define a field of view 1531 for the MEPET 1502. In addition, the collimator 1530 may provide sufficient shielding to limit count rates to manageable levels for the electronics of the MEPET 1502 to conduct the pulse processing.

The shielding 1540 may encase the MEPET 1502 generally, and may include tungsten, aluminum, or the like. The shielding 1540 may surround the MEPET 1502 on all sides (other than the MEPET aperture 1504) to reduce background count rates. The MEPET aperture 1504 may be covered (at least partially) by a degrader 1550. The degrader 1550 may include an aluminum foil or the like (e.g., about 0.35-mm thick foil made of a material such as aluminum) that is placed in front of the first silicon detector 1510 to establish the detector (or the MEPET 1502 generally) as solar blind, as well as to provide low energy cutoffs (e.g., low energy cutoffs of about 7 MeV for protons and about 340 keV for electrons). The remaining surfaces of the first silicon detector 1510 as well as the second silicon detector 1520 may be coated with a material to ensure that they are blind to solar UV as well—e.g., about 2-μm of aluminum may be used.

It will be understood that, although certain ranges of values and certain dimensions are shown in FIGS. 18 and 19, these are provided by way of example only, and other dimensions and ranges of values are also or instead possible.

Figure 20:
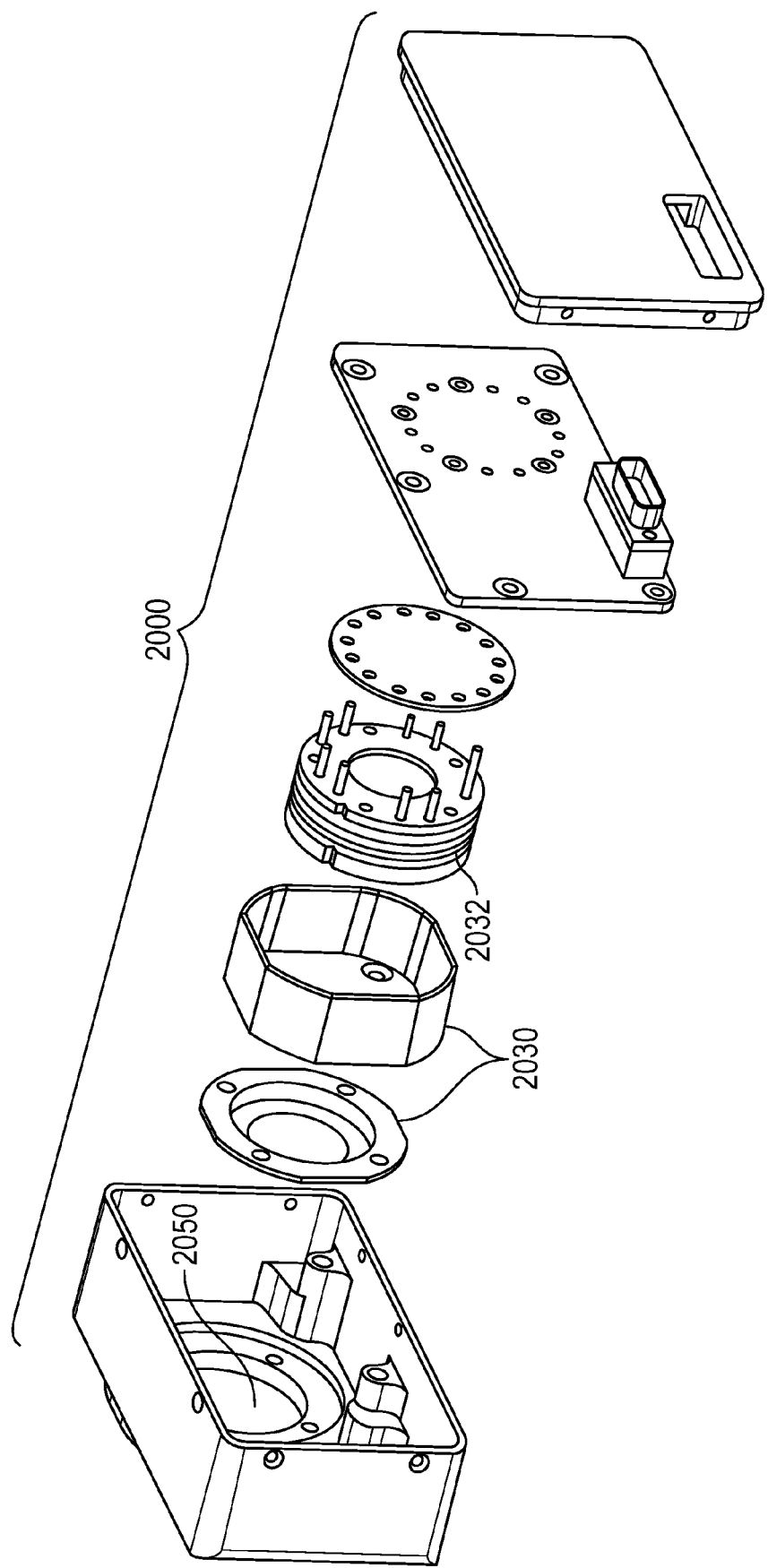
FIG. 20 illustrates an exploded view of a high energy proton electron telescope (HEPET), in accordance with a representative embodiment.
Figure 21:
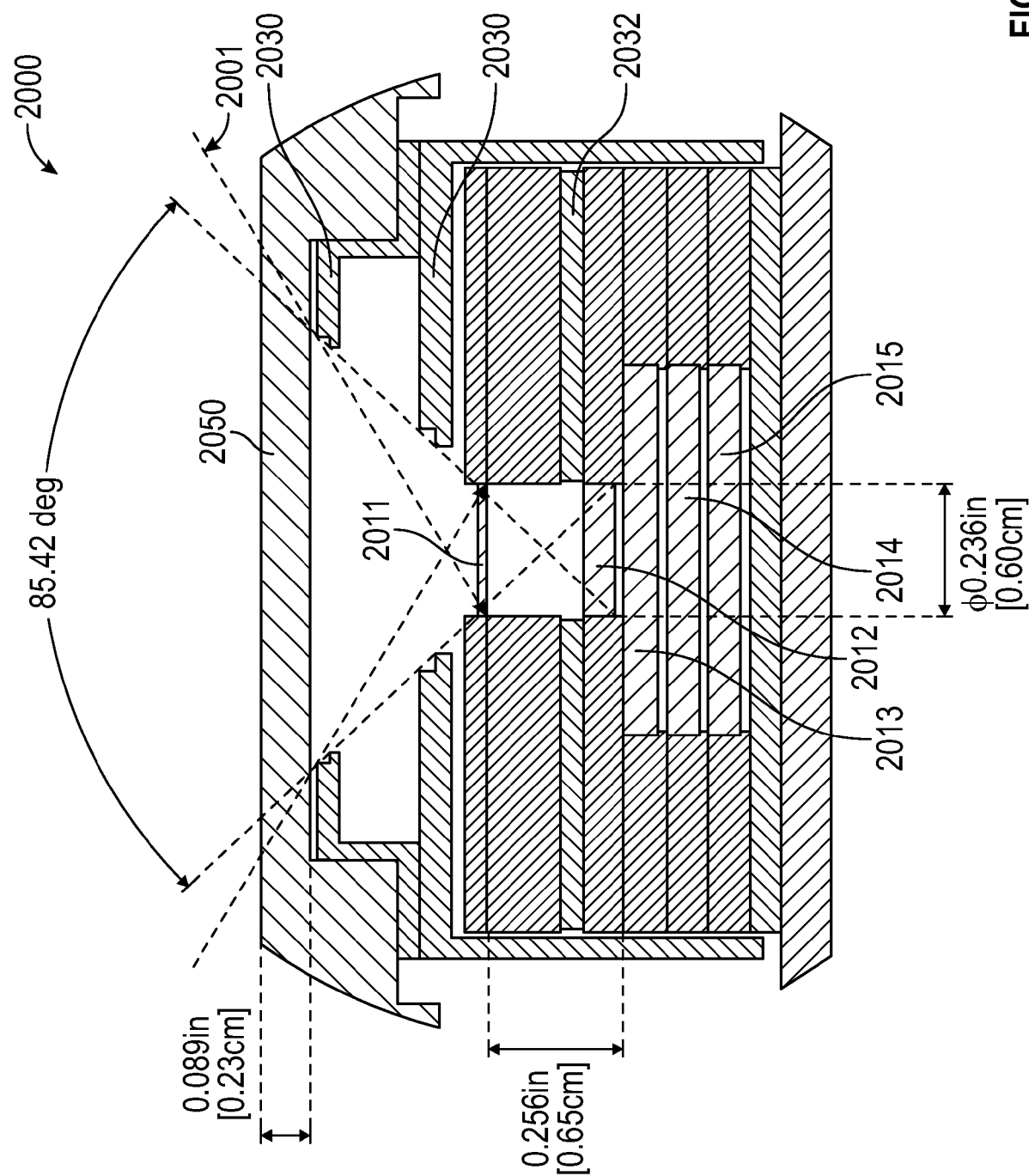
FIG. 21 illustrates a cross-sectional view of a HEPET, in accordance with a representative embodiment.

FIGS. 20 and 21 show a HEPET 2000. Specifically, FIG. 20 illustrates an exploded view of a HEPET 2000 and FIG. 21 illustrates a cross-sectional view of a HEPET 2000, in accordance with a representative embodiment. In general, the HEPET 2000 may be structurally configured to detect and measure electrons having energy within the range of about 1.5 MeV to about 5.0 MeV and protons having energy within the range of about 15.0 MeV to about 100.0 MeV. The HEPET 2000 may also or instead be structurally configured to determine dielectric charging and proton measurements for single event effects. The HEPET 2000 may also or instead be used to validate data from one or more of a LEPET and a MEPET.

The HEPET 2000 may include at least five ion-implanted silicon detectors, e.g., five ion-implanted circular silicon detectors—a first silicon detector 2011, a second silicon detector 2012, a third silicon detector 2013, a fourth silicon detector 2014, and a fifth silicon detector 2015 as shown in FIG. 21. The silicon detectors of the HEPET 2000 may be aligned coaxially, e.g., forming a detector stack.

The HEPET 2000 may include a component that defines a field of view 2001 for the silicon detector(s) contained therein. Specifically, in certain implementations, the detector stack of the HEPET 2000 may be aligned behind a degrader 2050—e.g., a degrader plate (e.g., having a thickness of about 0.23-cm)—that sets the lower cutoff energy for incident particles. The field of view 2001 for the HEPET 2000 may also or instead be actively defined by the first silicon detector 2011 and the second silicon detector 2012 as shown in FIG. 21. In addition, the HEPET 2000 may include one or more collimators 2030 (e.g., two collimators 2030) that further limit the field of view 2001 for one or more of the detectors, e.g., the first silicon detector 2011. Thus, in certain implementations, two collimators 2030 (e.g., made of tungsten or the like) may limit the field of view 2001 for the first silicon detector 2011 thereby limiting the maximum count rates that the first silicon detector 2011 experiences. Stated otherwise, the collimators 2030 may limit the field of view of the first silicon detector 2011 (i.e., the front detector element of the HEPET 2000) in order to lower the flux on this detector to a manageable level. In addition to these collimators 2030, a stopper 2032 (e.g., also made of tungsten or the like) disposed just in front of the second silicon detector 2012 may shield the back detectors (e.g., the third silicon detector 2013, the fourth silicon detector 2014, and the fifth silicon detector 2015), e.g., to prevent high count rates from occurring in these back detectors.

In the HEPET 2000, all of the silicon detectors may have the same or similar thickness, except for the first silicon detector 2011, which may be thinner. For example, each detector other than the first silicon detector 2011 (e.g., four of the five ion-implanted silicon detectors) may include an about 1500-μm thick ion-implanted silicon detector. In contrast, the first silicon detector 2011 may include a thickness of about 430-μm. In certain implementations, two or more of the silicon detectors of the HEPET 2000 as shown may instead be combined. For example, the third silicon detector 2013 and the fourth silicon detector 2014 may be combined into, e.g., a single detector having a thickness of about 3000-μm. Similar electronics signal chains may be used for the detectors of the HEPET 2000 as are used for the detectors of one or more of a LEPET and a MEPET.

In use, in order for a particle (also known as an event) to be registered in one of the channels of the HEPET 2000, or in buffered event data, simultaneous peaks may need to be detected on multiple detectors within a predetermined coincidence window (active collimation). The coincidence window may be adjustable, e.g., between the range of about 40 nanoseconds to about 720 nanoseconds. In this manner, the HEPET 2000 may be structurally configured to register a charged particle within one of its channels or in buffered event data when simultaneous peaks are detected in the first two detectors (e.g., the first silicon detector 2011 and the second silicon detector 2012) to register a particle. In addition, in certain implementations, for peaks in the other detectors to contribute to the event, no detector may be skipped (i.e., the particle must travel from front detector —the first silicon detector 2011—to the back detector—the fifth silicon detector 2015—and register in each detector). For example, in an implementation, if the first silicon detector 2011, the second silicon detector 2012, and the fifth silicon detector 2015 have peaks, but the third silicon detector 2013 and the fourth silicon detector 2014 do not, then the energy deposited in the fifth silicon detector 2015 may be discarded.

The HEPET 2000 may be structurally configured to collect data to generate at least four histograms. At least two of the four histograms may be associated with electrons, where, in some implementations, only electrons having a peak height below about 1.5 MeV are analyzed. Further, at least two of the four histograms may be configured to measure incident proton flux, where, in some implementations, a first histogram is for protons that register up to about 40 MeV and a second histogram is for protons that register up to about 100 MeV. Channels may be created from the histograms by summing adjacent histogram bins over a predetermined range.

The HEPET 2000 may be structurally configured to store energy deposits in an event-by-event basis into internal buffers based on type. The internal buffers may be zeroed out at the end of each measurement interval. These energy deposits may be used for one or more of calibration and diagnostics.

It will be understood that, although certain ranges of values and certain dimensions are shown in FIG. 21, these are provided by way of example only, and other dimensions and ranges of values are also or instead possible.

Thus, in certain implementations, the HEPET 2000 generates three internal sets of data as well as single counter data for each detector. The first two sets may be binned data—e.g., the first of these is a set of 128 bins for events that have peak heights less than 1/16th of the peak heights of the fourth silicon detector 2014, and may be called the non-penetrating histogram bins. These bins may be formed along the proton track (except for the first 15, which may be used for electrons) in a two-dimensional space with the x-axis being the sum of the first four detector's peak heights (taking into account the thinner first silicon detector 2011) and the y-axis being the peak height of the second silicon detector 2012. The reason for using a two-dimensional space rather than a single sum may be twofold: (1) a two-dimensional space may reduce the impact of spurious rare events, and (2) the use of the second silicon detector 2012 as the y-dimension may allow particles that only partially pass through the active region of the second silicon detector 2012 to be rejected (e.g., corner cutters). The second set of histogram bins may be done in a space with the x-axis being the sum of all of the detector's peak heights (taking into account the thinner first silicon detector 2011) and the y-axis being the sum of the first four detector's peak heights (taking into account the thinner first silicon detector 2011). In addition to the histogram binned data, the HEPET 2000 may also store samples of event data. This can be used for detailed anomaly analysis as well as for diagnostic purposes to better understand anomalous behavior that may occur within the HEPET's channel data.

Figure 22:
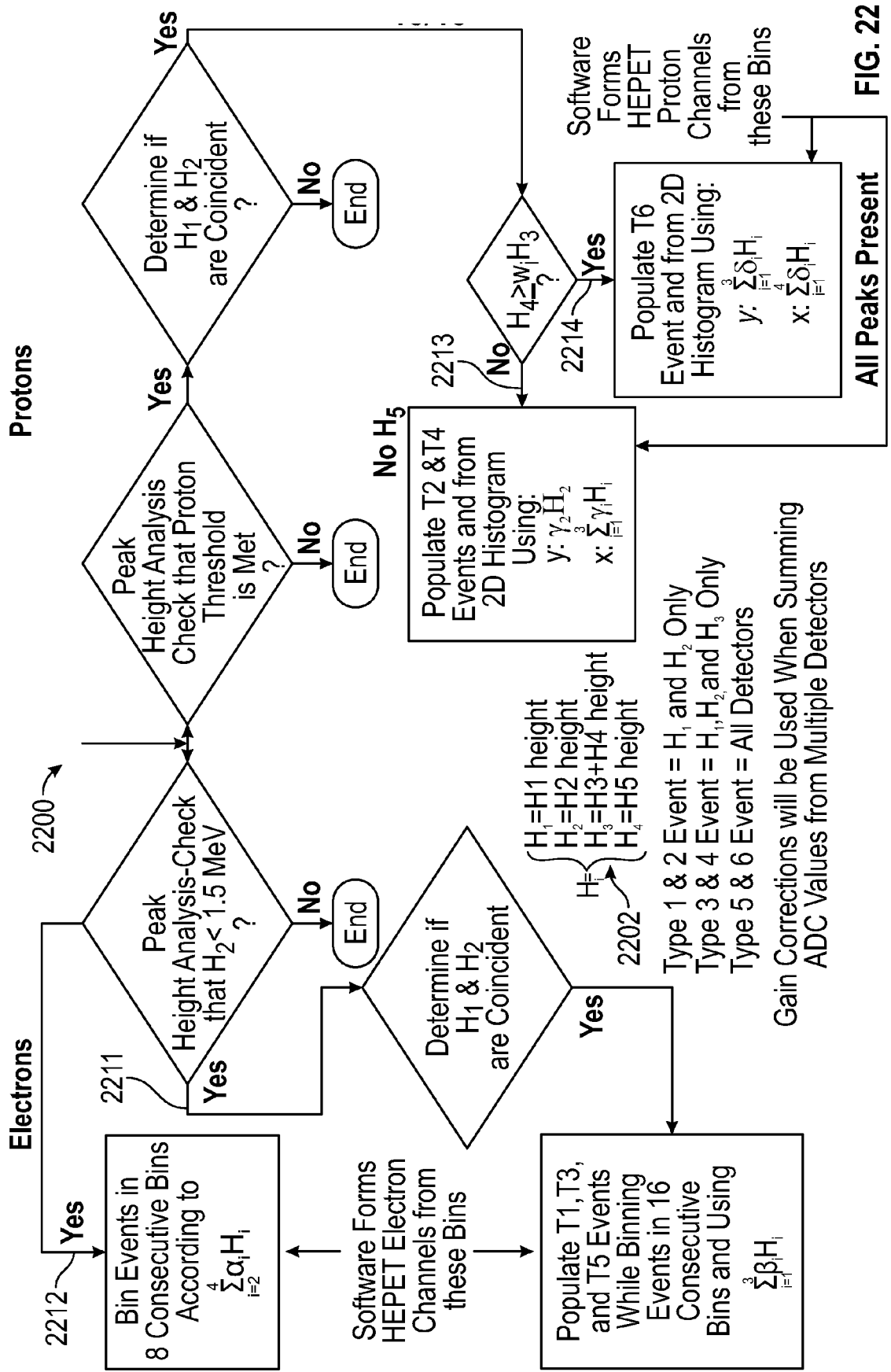
FIG. 22 illustrates a signal processing diagram for an environmental sensor, in accordance with a representative embodiment.

FIG. 22 illustrates a signal processing diagram 2200 for an environmental sensor, in accordance with a representative embodiment. Processing of data from the HEPET may be more complex than the processing of data from the LEPET or the MEPET. This may be because the HEPET is structurally configured to measure high energy protons and electrons with minimal cross-contamination by other particle species even at low fluxes in the primary channels. Thus, multiple detectors may be used because the maximum thickness of the silicon detectors may be limited, e.g., to approximately 1500-μm, and the range of the higher energy particles may exceed this limitation.

As shown in FIG. 22, the HEPET sensor may generate at least four histograms 2202 (e.g., shown as $H_i$ in the figure, where i represents the number of the histogram, H). From these histograms, the channels may be created by summing adjacent histogram bins over user-defined ranges. The first two histograms may be associated with electrons, and this may be because only events with the peak height of the second silicon detector being below about 1.5 MeV may be analyzed (the second silicon detector is represented by 'H2' in the figure, and similarly the first silicon detector is represented by 'H1,' the third silicon detector is represented by 'H3,' the fourth silicon detector is represented by 'H4,' and the fifth silicon detector is represented by 'H5' in FIG. 22). In addition, the histogram bins may be chosen so that the channel sums correspond to electron energy depositions.

The primary histogram in the figure may be path 2211. The histogram of path 2212 may be provided for cases when the H1 sensor is overwhelmed with counts due to relatively high fluxes (which may occur less than 0.1% of the time). In those cases, these channels can be used to determine high energy electron fluxes. A disadvantage of path 2212 may include that this path may be much more susceptible to contamination due to protons as well as higher energy electrons. For that reason, path 2212 may not be the primary path used for measuring high energy electron fluxes. The remaining two histograms 2202 that are generated may be for measuring incident proton flux. For example, the third histogram $H_3$ may be for protons that stop in or before the H4 detector and measure up to about 40 MeV protons, and the fourth histogram $H_4$ may be for protons that pass through the H4 detector and measure up to about 100 MeV protons. In addition to these histograms 2202, energy deposits on an event by event basis may be stored into internal buffers based on the six different types shown in FIG. 22. The buffers may be limited in size and may be zeroed out at the end of each measurement interval. This data may usefully be provided for calibration and diagnostic purposes as stated above.

Thus, as described herein, an environmental sensor may include a plurality of silicon detector telescopes, each including a plurality of silicon plates therein. It will be understood that the number of silicon detector telescopes, and the number of silicon plates in each of the silicon detector telescopes, are provided by way of example, and thus, there can be a different number for different energies or otherwise.

Figure 23:
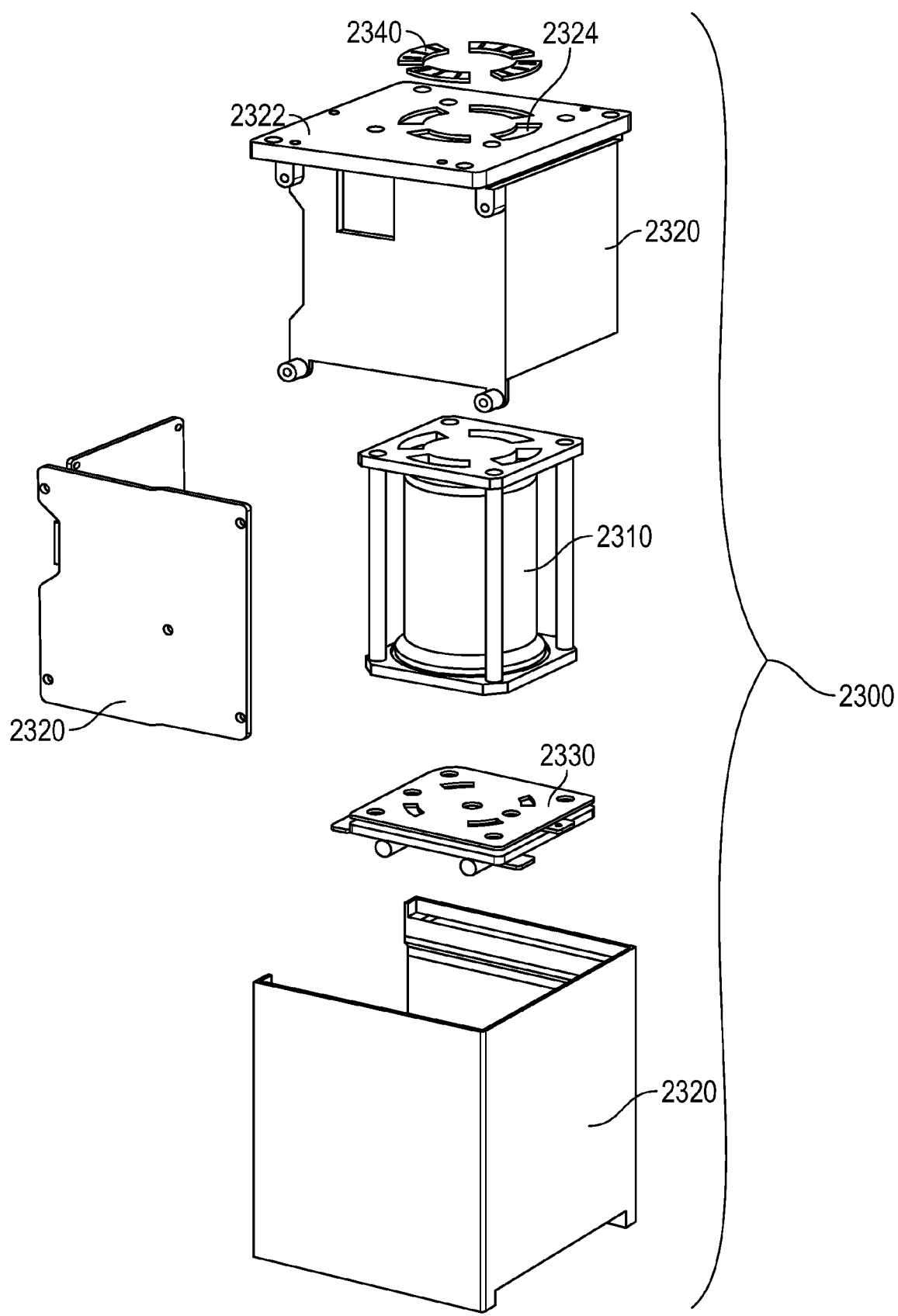
FIG. 23 illustrates an exploded view of an ESA module, in accordance with a representative embodiment.

FIG. 23 illustrates an exploded view of an ESA module 2300, in accordance with a representative embodiment. The ESA module 2300 may be part of an environmental sensor as described herein, and may generally include an ESA 2310 (which may be the same or similar to any of the ESAs described elsewhere herein), a housing 2320 (which may be formed in multiple portions as shown in the figure), hardware 2330 (e.g., for controlling and/or providing power to the ESA 2310), and entrance filters 2340 (which may be the same or similar to those described herein).

In general, the ESA module 2300 may include an ESA 2310 structurally configured for charged particle detection, where the ESA 2310 generates controllable electric fields to provide energy filtering of incoming charged particles, and where, after filtering, the charged particles impact a charge multiplier (e.g., included on the hardware 2330 shown in the figure) to establish a detectable signal.

The housing 2320 may include a top plate 2322 and shielding or insulation as described herein. The top plate 2322 may include voids 2324 for coupling with the entrance filters 2340. The top plate 2322 may be the same or similar to any of the top surfaces of ESAs described elsewhere herein.

The hardware 2330 may include electronics, controllers (such as any of those described herein), communications interfaces or devices, sensors, and the like that work in conjunction with the ESA 2310 or other components of an environmental sensor that includes the ESA module 2300. For example, the hardware 2330 may include one or more printed circuit boards (PCBs), which may be disposed on portions of the housing 2320 or otherwise. For example, a PCB may be included for an interface for the ESA 2310, a power supply, a master control panel or controller, and so on.

The entrance filters 2340 may be disposed between a pathway through the ESA 2310 and an external environment. The entrance filters 2340 may define a plurality of openings aligned at a predetermined angle thereby limiting one or more fields of view between the pathway through the ESA 2310 and the external environment. In this manner, the entrance filters 2340 may filter particles, by their trajectory, from entering the ESA 2310 for analysis.

Figure 24:
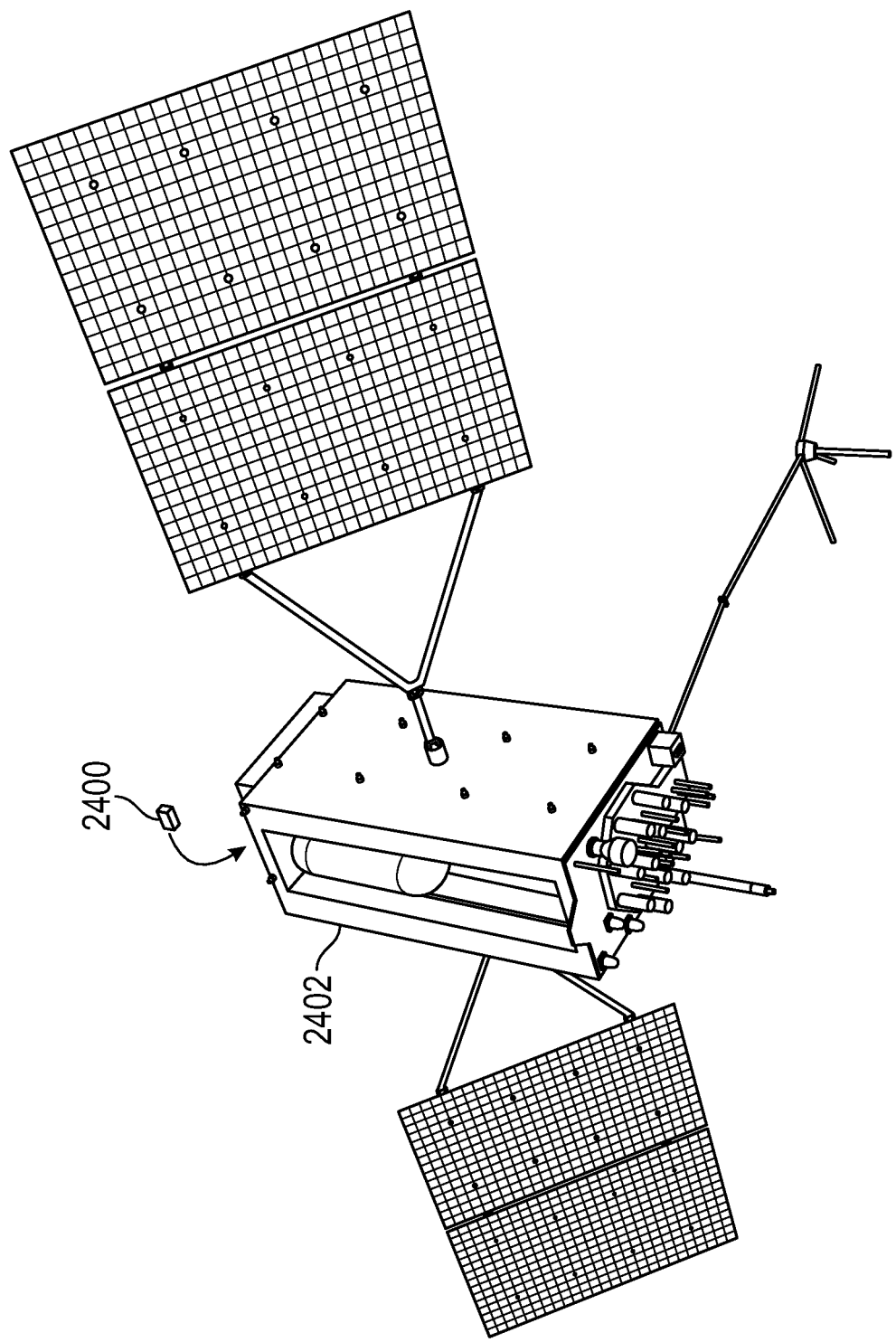
FIG. 24 illustrates an environmental sensor in use, in accordance with a representative embodiment.

FIG. 24 illustrates an environmental sensor 2400 in use, in accordance with a representative embodiment. In particular, FIG. 24 shows an example of a use case where the environmental sensor 2400 is included on a satellite 2402. Other use cases are also or instead possible as described herein or as will be apparent to a skilled artisan.

Examples of techniques for environmental sensing (e.g., for anomaly prediction or detection) will now be discussed.

In use, shaped pulses from all sensor detectors in an environmental sensor (except the second LEPET detector in some implementations) may be output to a mixed signal board (e.g., at the instrument base) that contains analog to digital converters that digitize the shaped pulses. The digitized data may then be sent to a computing device or the like for the remainder of the analysis. In certain implementations, the signal from the second LEPET detector goes directly to an analog comparator that outputs a discrete pulse to a mixed signal board indicating that the pulse exceeded a threshold (e.g., about 0.23 MeV for certain implementations). Digital peak detection modules may be used to determine peak amplitudes and also to provide trigger pulses indicating that a peak has been observed. From there, coincidence (e.g., from the HEPET) or anticoincidence (e.g., from the LEPET) logic may be used to bin detected events based on energy deposited in each of the telescopes' detectors. Sums of these bins may then be used to form the primary channels that may be used to determine the incident proton and electron flux. This may be done to simplify the design as it may not require a small set of channels to have to be defined. A processor may be used to control the overall operation of the instrument, packetize data, and send/receive telemetry from a spacecraft or the like. The mixed signal board may also include drivers that are used to communicate with a spacecraft bus, e.g., using a standard serial protocol.

Figure 25:
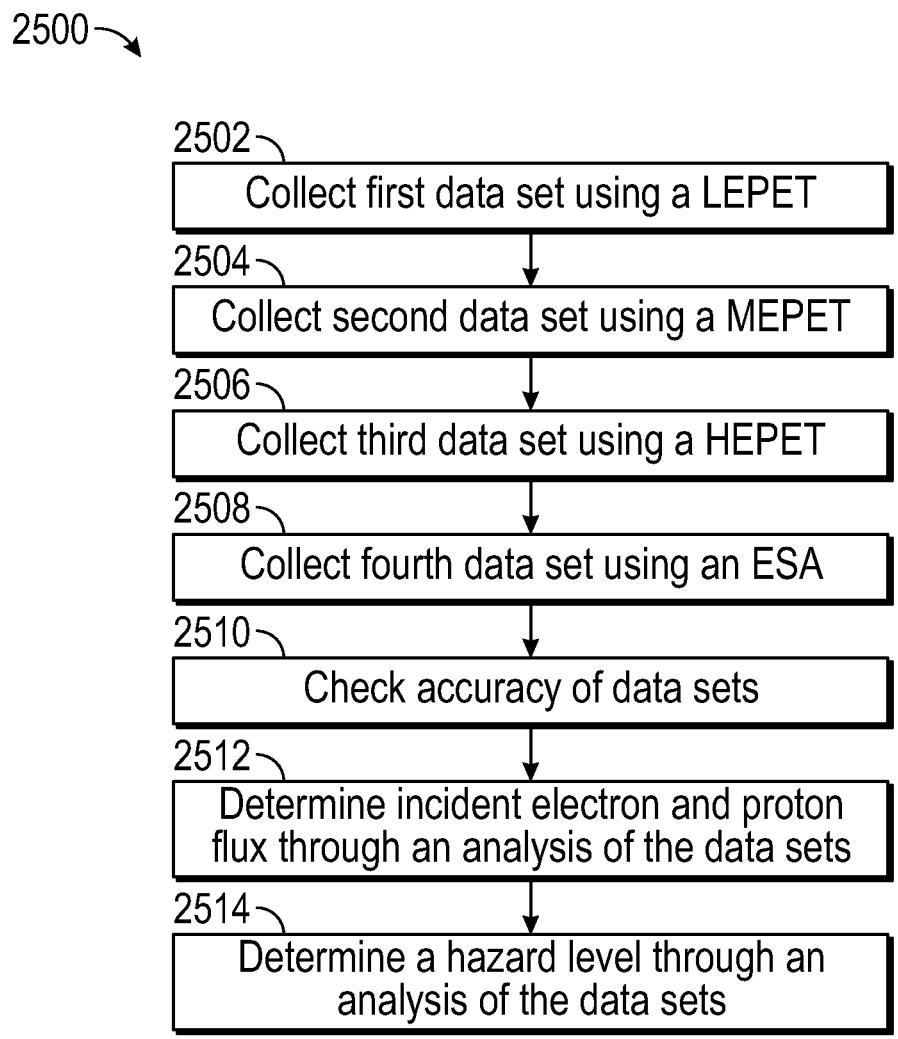
FIG. 25 is a flow chart of a method for detecting and measuring charged particles, in accordance with a representative embodiment.

FIG. 25 is a flow chart of a method 2500 for detecting and measuring charged particles, in accordance with a representative embodiment. The method 2500 may be performed using one or more environmental sensors as described herein.

As shown in block 2502, the method 2500 may include collecting a first data set using a LEPET, such as any of the LEPETs described herein. The first data set may include electron data from a first electron energy range and proton data from a first proton energy range. For example, the first electron energy range may be about 0.1 MeV to about 0.5 MeV, and the first proton energy range may be about 2.0 MeV to about 8.0 MeV.

As shown in block 2504, the method 2500 may include collecting a second data set using a MEPET, such as any of the MEPETs described herein. The second data set may include electron data from a second electron energy range and proton data from a second proton energy range. For example, the second electron energy range may be about 0.5 MeV to about 1.7 MeV, and the second proton energy range may be about 8.0 MeV to about 18.0 MeV.

As shown in block 2506, the method 2500 may include collecting a third data set using a HEPET, such as any of the HEPETs described herein. The third data set may include electron data from a third electron energy range and proton data from a third proton energy range. For example, the third electron energy range may be about 1.5 MeV to about 5.0 MeV, and the third proton energy range may be about 15.0 MeV to about 100.0 MeV. The method 2500 may also include registering an event when a peak is detected on two or more detectors sequentially from the front of the HEPET within a predetermined coincidence window (e.g., an adjustable coincidence window, where the method 2500 may further include adjusting the predetermined coincidence window). The event may be registered in one or more of a channel of the HEPET and buffered event data.

As shown in block 2508, the method 2500 may include collecting a fourth data set using an ESA, such as any of the ESAs described herein. The fourth data set may include data related to the detection of charged particles. By way of example, the charged particles detected by the ESA may include charged particles having an energy range of about 30 eV to about 50 keV (e.g., about 100 eV to about 40 keV).

The method 2500 may further include defining or limiting a field of view for one or more of the LEPET, the MEPET, and the HEPET, e.g., using one or more collimators. The collimators may also or instead be used to shield one or more of the LEPET, the MEPET, and the HEPET. Similarly, the method 2500 may include defining or limiting a field of view for the ESA using one or more apertures, e.g., apertures included in an entrance filter as described herein.

When collecting one or more of the data sets (e.g., the first data set, the second data set, the third data set, and the fourth data set), a predetermined threshold may be set for obtaining data above (or below) that threshold (e.g., a threshold energy value, in which charged particles are counted that have an energy above that threshold). Stated otherwise, the method 2500 may further include recording counts for events above a predetermined threshold. In certain implementations, the predetermined threshold may be adjusted by a user.

The data sets may be collected by placing data related to particles into bins, which may then be used to create histograms for analysis of the data. To this end, the method 2500 may include depositing incident particles into at least one of a plurality of bins when the incident particles deposit energy in a first detector of one or more of the LEPET and the MEPET (e.g., the front detector) but do not deposit enough energy to trigger a comparator circuit for a second detector of one or more of the LEPET and the MEPET (e.g., the back detector) within a predetermined anticoincidence window. The anticoincidence window may be adjustable by a user. There may be about 1024 bins in the plurality of bins. The method 2500 may also or instead include forming primary energy channels by summing adjacent bins within a histogram for one or more of the first data set and the second data set. To that end, the method 2500 may include modifying the primary energy channels.

The method 2500 may include generating histograms from data collected. For example, the method 2500 may include generating at least four histograms from the third data set. As discussed herein, the method 2500 may also include creating channels by summing adjacent histogram bins over a predetermined range. In this manner, the method 2500 may also include determining high energy electron fluxes using the channels. Also, or instead, the method 2500 may include measuring incident proton flux using at least two of the four histograms.

The method 2500 may include storing energy deposits in an internal buffer based on type. In this manner, the method 2500 may further include using data from the internal buffer for one or more of calibration and diagnostics.

As shown in block 2510, the method 2500 may include checking the accuracy of one or more of the data sets. For example, the method 2500 may include checking the accuracy of one or more of the first data set and the second data set using the third data set.

As shown in block 2512, the method 2500 may include determining incident electron flux and incident proton flux by using a spectrum of counts versus energy deposited from one or more of the first data set, the second data set, the third data set, and the fourth data set.

As shown in block 2514, the method 2500 may include determining a hazard level caused by charged particles by analyzing one or more of the first data set, the second data set, the third data set, and the fourth data set.

As part of, or separate from, determining the hazard level or the possibility of an anomaly caused by charged particles, the method 2500 may further include other related determinations, e.g., determinations that show a risk for certain components/equipment. For example, the method 2500 may include determining anomaly attribution for deep dielectric charging in one or more enclosures using the electron data from one or more of the LEPET, the MEPET, and the HEPET. The method 2500 may also or instead include determining displacement damage analysis using the proton data from one or more of the LEPET, the MEPET, and the HEPET. Also, or instead, the method 2500 may include determining total event dose for a component using one or more of the electron data and the proton data from one or more of the LEPET, the MEPET, and the HEPET, as well as from using data from the ESA (e.g., for unshielded components such as solar panels). Further, the method 2500 may include determining a surface charging hazard using the fourth data set from the ESA.

Therefore, an environmental sensor as described herein may be used for acquiring data related to flux and energy of charged particles in an environment for using the data to determine, in substantially real time, whether the environment is conducive to an anomaly caused by the charged particles. Such a sensor may include an ESA structurally configured for charged particle detection, the ESA generating controllable electric fields to provide energy filtering of incoming charged particles, where, after filtering, the charged particles impact a charge multiplier to establish a detectable signal, and where a range of charged particle detection for the ESA is between about 50 eV to about 50 keV. The sensor may further include a plurality of silicon detector telescopes including: a LEPET structurally configured to detect and measure electrons having energy within the range of about 0.1 MeV to about 0.5 MeV and protons having energy within the range of about 2.0 MeV to about 8.0 MeV; a MEPET structurally configured to detect and measure electrons having energy within the range of about 0.5 MeV to about 1.7 MeV and protons having energy within the range of about 8.0 MeV to about 18.0 MeV; and a HEPET structurally configured to detect and measure electrons having energy within the range of about 1.5 MeV to about 5.0 MeV and protons having energy within the range of about 15.0 MeV to about 100.0 MeV. The sensor may further include a housing containing at least a portion of the ESA and each of the plurality of silicon detector telescopes, where the housing includes an aperture for the ESA (e.g., four apertures for the ESA) and each of the plurality of silicon detector telescopes (e.g., one for each silicon detector telescope, where one or more of these apertures may be shielded).

The above systems, devices, methods, processes, and the like may be realized in hardware, software, or any combination of these suitable for a particular application. The hardware may include a general-purpose computer and/or dedicated computing device. This includes realization in one or more microprocessors, microcontrollers, embedded microcontrollers, programmable digital signal processors or other programmable devices or processing circuitry, along with internal and/or external memory. This may also, or instead, include one or more application specific integrated circuits, programmable gate arrays, programmable array logic components, or any other device or devices that may be configured to process electronic signals. It will further be appreciated that a realization of the processes or devices described above may include computer-executable code created using a structured programming language such as C, an object oriented programming language such as C++, or any other high-level or low-level programming language (including assembly languages, hardware description languages, and database programming languages and technologies) that may be stored, compiled, or executed to run on one of the above devices, as well as heterogeneous combinations of processors, processor architectures, or combinations of different hardware and software. In another implementation, the methods may be embodied in systems that perform the steps thereof, and may be distributed across devices in a number of ways. At the same time, processing may be distributed across devices such as the various systems described above, or all of the functionality may be integrated into a dedicated, standalone device or other hardware. In another implementation, means for performing the steps associated with the processes described above may include any of the hardware and/or software described above. All such permutations and combinations are intended to fall within the scope of the present disclosure.

Embodiments disclosed herein may include computer program products comprising computer-executable code or computer-usable code that, when executing on one or more computing devices, performs any and/or all of the steps thereof. The code may be stored in a non-transitory fashion in a computer memory, which may be a memory from which the program executes (such as random-access memory associated with a processor), or a storage device such as a disk drive, flash memory or any other optical, electromagnetic, magnetic, infrared or other device or combination of devices. In another implementation, any of the systems and methods described above may be embodied in any suitable transmission or propagation medium carrying computer-executable code and/or any inputs or outputs from same.

It will be appreciated that the devices, systems, and methods described above are set forth by way of example and not of limitation. Absent an explicit indication to the contrary, the disclosed steps may be modified, supplemented, omitted, and/or re-ordered without departing from the scope of this disclosure. Numerous variations, additions, omissions, and other modifications will be apparent to one of ordinary skill in the art. In addition, the order or presentation of method steps in the description and drawings above is not intended to require this order of performing the recited steps unless a particular order is expressly required or otherwise clear from the context.

The method steps of the implementations described herein are intended to include any suitable method of causing such method steps to be performed, consistent with the patentability of the following claims, unless a different meaning is expressly provided or otherwise clear from the context. So, for example performing the step of X includes any suitable method for causing another party such as a remote user, a remote processing resource (e.g., a server or cloud computer) or a machine to perform the step of X. Similarly, performing steps X, Y, and Z may include any method of directing or controlling any combination of such other individuals or resources to perform steps X, Y, and Z to obtain the benefit of such steps. Thus, method steps of the implementations described herein are intended to include any suitable method of causing one or more other parties or entities to perform the steps, consistent with the patentability of the following claims, unless a different meaning is expressly provided or otherwise clear from the context. Such parties or entities need not be under the direction or control of any other party or entity, and need not be located within a particular jurisdiction.

It should further be appreciated that the methods above are provided by way of example. Absent an explicit indication to the contrary, the disclosed steps may be modified, supplemented, omitted, and/or re-ordered without departing from the scope of this disclosure.

It will be appreciated that the methods and systems described above are set forth by way of example and not of limitation. Numerous variations, additions, omissions, and other modifications will be apparent to one of ordinary skill in the art. In addition, the order or presentation of method steps in the description and drawings above is not intended to require this order of performing the recited steps unless a particular order is expressly required or otherwise clear from the context. Thus, while particular embodiments have been shown and described, it will be apparent to those skilled in the art that various changes and modifications in form and details may be made therein without departing from the scope of this disclosure and are intended to form a part of the disclosure as defined by the following claims, which are to be interpreted in the broadest sense allowable by law.

The various representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

What is claimed is:

1. An environmental sensor for acquiring data related to flux and energy of charged particles in a space environment for using the data to determine, in substantially real time, whetherthe space environment is conducive to an anomaly caused by the charged particles, the sensor comprising:
    a spiral electrostatic analyzer structurally configured for charged particle detection in the space environment and including a cylindrical section having an axis, the spiral electrostatic analyzer generating a controllable radial electric field with respect to the axis to provide energy filtering of incoming charged particles, where, after filtering, the charged particles impact a charge multiplier to establish a detectable signal, wherein the cylindrical section comprises two conductive cylinders coaxially aligned, with a first cylinder placed at least partially inside a second cylinder, each cylinder comprising an electrical terminal to apply a bias voltage thereto; and
    a plurality of silicon detector telescopes structurally configured to collectively detect electrons having energy within the range of 100 electronvolts (eV) to 5 megaelectronvolts (MeV) and to collectively detect protons having energy within the range of 2 MeV to 100 MeV.

2. The sensor of claim 1, where the plurality of silicon detector telescopes comprise a low energy proton electron telescope (LEPET), a medium energy proton electron telescope (MEPET), and a high energy proton electron telescope (HEPET).

3. The sensor of claim 2, where the LEPET is structurally configured to detect and measure electrons having energy within the range of 0.1 MeV to 0.5 MeV and protons having energy within the range of 2.0 MeV to 8.0 MeV.

4. The sensor of claim 2, where the LEPET comprises at least two distinct ion-implanted silicon detectors.

5. The sensor of claim 4, where the at least two distinct ion-implanted silicon detectors comprise a 430-µm thick ion-implanted silicon detector and a 1500-µm thick ion-implanted silicon detector.

6. The sensor of claim 2, where the LEPET comprises a shielding establishing the LEPET as solar blind, where the shielding provides low energy cutoffs of 840 keV for protons and 40 keV for electrons.

7. The sensor of claim 2, where the MEPET is structurally configured to detect and measure electrons having energy within the range of 0.5 MeV to 1.7 MeV and protons having energy within the range of 8.0 MeV to 18.0 MeV.

8. The sensor of claim 2, where the MEPET comprises at least two ion-implanted silicon detectors.

9. The sensor of claim 8, where each of the at least two ion-implanted silicon detectors comprise a 1500-μm thick ion-implanted silicon detector.

10. The sensor of claim 2, where the MEPET comprises a shielding establishing the MEPET as solar blind, where the shielding provides low energy cutoffs of 7 MeV for protons and 340 keV for electrons.

11. The sensor of claim 2, where the HEPET is structurally configured to detect and measure electrons having energy within the range of 1.5 MeV to 5.0 MeV and protons having energy within the range of 15.0 MeV to 100.0 MeV.

12. The sensor of claim 2, where the HEPET comprises at least five ion-implanted silicon detectors.

13. The sensor of claim 12, where one of the at least five ion-implanted silicon detectors comprises a 430-μm thick ion-implanted silicon detector, and where four of the at least five ion-implanted silicon detectors each comprise a 1500-μm thick ion-implanted silicon detector.

14. The sensor of claim 2, where one or more of the LEPET, the MEPET, and the HEPET is structurally configured to use a spectrum of counts versus energy deposited to determine incident electron and proton fluxes.

15. The sensor of claim 2, where one or more of the LEPET, the MEPET, and the HEPET comprises a collimator defining a field of view and providing a shielding to limit count rates to a predetermined level in order to conduct pulse processing.

16. The sensor of claim 1 wherein the spiral electrostatic analyzer cylindrical section extends from a first end to a second end and further comprises a helical pathway disposed between the first cylinder and the second cylinder defining a helical path through the cylindrical section for the charged particles to travel therethrough.

17. The sensor of claim 16 wherein the spiral electrostatic analyzer further comprises an entrance filter disposed on the first end.

18. The sensor of claim 17 wherein the entrance filter defines a plurality of openings aligned at a predetermined angle limiting at least one field of view between the pathway and the space environment.

19. The sensor of claim 17 wherein the spiral electrostatic analyzer further comprises a detector disposed at the second end to detect charged particles that have traversed the helical path from the entrance filter.

20. An environmental sensor for acquiring data related to flux and energy of charged particles in a space environment for using the data to determine, in substantially real time, whether the space environment is conducive to an anomaly caused by the charged particles, the sensor comprising:
   a spiral electrostatic analyzer structurally configured for charged particle detection in the space environment and including a cylindrical section having an axis, the spiral electrostatic analyzer generating a controllable radial electric field with respect to the axis to provide energy filtering of incoming charged particles, where, after filtering, the charged particles impact a charge multiplier to establish a detectable signal, and where a range of charged particle detection for the spiral electrostatic analyzer is between 50 electronvolts (eV) to 50 kilo-electronvolts (keV);
   a plurality of silicon detector telescopes comprising:
      a low energy proton electron telescope (LEPET) structurally configured to detect and measure electrons having energy within the range of 0.1 mega-electronvolts (MeV) to 0.5 MeV and protons having energy within the range of 2.0 MeV to 8.0 MeV;
      a medium energy proton electron telescope (MEPET) structurally configured to detect and measure electrons having energy within the range of 0.5 MeV to 1.7 MeV and protons having energy within the range of 8.0 MeV to 18.0 MeV; and
      a high energy proton electron telescope (HEPET) structurally configured to detect and measure electrons having energy within the range of 1.5 MeV to 5.0 MeV and protons having energy within the range of 15.0 MeV to 100.0 MeV; and
   a housing containing at least a portion of the spiral electrostatic analyzer and each of the plurality of silicon detector telescopes, the housing comprising an aperture for the spiral electrostatic analyzer and each of the plurality of silicon detector telescopes.

* * * * *